(12) United States Patent
Ejiri et al.

(10) Patent No.: US 12,354,914 B2
(45) Date of Patent: Jul. 8, 2025

(54) METHOD FOR PRODUCING SUBSTRATE HAVING THROUGH-SILICON VIAS, SUBSTRATE HAVING THROUGH-SILICON VIAS, AND COPPER PASTE FOR THROUGH-SILICON VIA FORMATION

(71) Applicant: Showa Denko Materials Co., Ltd., Tokyo (JP)

(72) Inventors: Yoshinori Ejiri, Tokyo (JP); Hideo Nakako, Tokyo (JP); Yuki Kawana, Tokyo (JP); Motoki Yonekura, Tokyo (JP); Shinichirou Sukata, Tokyo (JP); Manabu Ishii, Tokyo (JP); Masaru Fujita, Tokyo (JP); Michiko Natori, Tokyo (JP); Masahiro Kimura, Tokyo (JP); Ryo Honna, Tokyo (JP)

(73) Assignee: Resonac Corporation, Tokyo (JP)

( * ) Notice: Subject to any disclaimer, the term of this patent is extended or adjusted under 35 U.S.C. 154(b) by 676 days.

(21) Appl. No.: 17/605,138

(22) PCT Filed: Apr. 24, 2019

(86) PCT No.: PCT/JP2019/017509
§ 371 (c)(1),
(2) Date: Oct. 20, 2021

(87) PCT Pub. No.: WO2020/217361
PCT Pub. Date: Oct. 29, 2020

(65) Prior Publication Data
US 2022/0230918 A1     Jul. 21, 2022

(51) Int. Cl.
*H01L 21/768*   (2006.01)
*H01L 23/48*    (2006.01)
*H01L 25/065*   (2023.01)

(52) U.S. Cl.
CPC .. *H01L 21/76898* (2013.01); *H01L 21/76883* (2013.01); *H01L 23/481* (2013.01); *H01L 25/0657* (2013.01)

(58) Field of Classification Search
CPC ................. H01L 21/768; H01L 21/288; H01L 21/76883; H01L 21/76885;
(Continued)

(56) References Cited

U.S. PATENT DOCUMENTS

| | | | |
|---|---|---|---|
| 2001/0010617 A1* | 8/2001 | Miyazaki | H01F 41/046 156/89.12 |
| 2005/0172483 A1* | 8/2005 | Sugita | H05K 3/4069 523/303 |

FOREIGN PATENT DOCUMENTS

| | | |
|---|---|---|
| JP | H11-345933 A | 12/1999 |
| JP | 2012-119611 A | 6/2012 |

(Continued)

OTHER PUBLICATIONS

Katsuhiro Ueda, Sumio Inafuku, Iwao Mori, "Obtainment of Sectional Area of Stearic Acid Molecule—Experimental Value and Calculated Value—", Chemistry & Education, 1992, vol. 40 No.2, p. 114-p. 11 (cited in specification).

*Primary Examiner* — Chuong A Luu
(74) *Attorney, Agent, or Firm* — FITCH, EVEN, TABIN & FLANNERY, LLP

(57) ABSTRACT

An aspect of the invention is a method for producing a substrate having through-silicon vias, the method including a preparation step of preparing a silicon substrate provided with through-holes, in which the through-holes communicate with both principal surfaces; a copper sintered body formation step of forming a copper sintered body having a porous structure such that the copper sintered body fills at least the through-holes; a resin impregnation step of impregnating the copper sintered body with a curable resin com- (Continued)

position; and a resin curing step of curing the curable resin composition impregnated into the copper sintered body to form an electric conductor that includes the copper sintered body having pores filled with a resin cured product, and providing through-silicon vias in the through-holes.

13 Claims, 10 Drawing Sheets

(58) Field of Classification Search
CPC . H01L 21/76898; H01L 23/48; H01L 23/481; H01L 23/522; H01L 23/532; H01L 23/53228; H01L 25/00; H01L 25/065; H01L 25/0657; H01L 25/50; H01L 2225/06513; H01L 2225/06517; H01L 2225/06544
USPC ......................................................... 438/637
See application file for complete search history.

(56) References Cited

FOREIGN PATENT DOCUMENTS

| JP | 2014-175529 A | 9/2014 |
| JP | 2015-153550 A | 8/2015 |
| JP | 2018-006507 A | 1/2018 |
| JP | 2019-016712 A | 1/2019 |

* cited by examiner (c)

(d)

(e)

(f)

(g)

(h)

(a)

(b)

METHOD FOR PRODUCING SUBSTRATE HAVING THROUGH-SILICON VIAS, SUBSTRATE HAVING THROUGH-SILICON VIAS, AND COPPER PASTE FOR THROUGH-SILICON VIA FORMATION

CROSS-REFERENCE TO RELATED APPLICATIONS

This application is a U.S. national phase application filed under 35 U.S.C. § 371 of International Application No. PCT/JP2019/017509, filed Apr. 24, 2019, designating the United States, which is hereby incorporated herein by reference in its entirety.

TECHNICAL FIELD

The present invention relates to a method for producing a substrate having through-silicon vias, a substrate having through-silicon vias, and a copper paste for through-silicon via formation.

BACKGROUND ART

In recent years, for the purpose of size reduction, functional enhancement, and integration of electronic equipment or components, attention has been paid to three-dimensional mounting technologies of inserting electrodes called through-silicon vias (TSV) into a silicon substrate to electrically connect silicon substrates that are disposed up and down, and laminating semiconductor chips in the vertical direction (height direction) at a high density.

As a technique for forming through-silicon vias, for example, Patent Literature 1 discloses a method for producing a semiconductor device having through-silicon vias, the method including a step of plating non-through vias formed in a silicon substrate with copper by electroplating using a specific copper plating solution.

CITATION LIST

Patent Literature

Patent Literature 1: Japanese Unexamined Patent Publication No. 2019-16712

SUMMARY OF INVENTION

Technical Problem

However, in the method described in Patent Literature 1, since it is necessary to perform plating while suppressing the precipitation rate of a copper film, the working time is extended, and there is a problem in terms of productivity.

On the other hand, the substrate having through-silicon vias is required to have sufficient electrical conductivity as well as excellent connection reliability, with which the resistance value is not likely to increase even when the substrate is subjected to a temperature change.

Thus, according to an aspect of the present invention, it is an object to provide a method for producing, with high productivity, a substrate having through-silicon vias, the substrate having sufficient electrical conductivity as well as excellent connection reliability; a substrate having through-silicon vias, the substrate having sufficient electrical conductivity as well as excellent connection reliability; and a copper paste for through-silicon via formation used for forming through-silicon vias.

Solution to Problem

The inventors of the present invention repeatedly conducted thorough investigation in order to achieve the above-described object, and as a result, the inventors provided through-silicon vias formed from an electric conductor packed in through-holes, by forming a copper sintered body having a porous structure within through-holes of a substrate having through-silicon vias, subsequently impregnating this copper sintered body with a curable resin composition, and curing this curable resin composition to form an electric conductor including the copper sintered body, the copper sintered body having pores filled with a resin cured product. Then, the present inventors found that a substrate having through-silicon vias, in which through-holes are filled with such an electric conductor, exhibits a sufficiently low initial resistance value, and that even in a temperature cycle connection reliability test, the resistance value is not likely to increase, thus completing the present invention.

That is, an aspect of the present disclosure provides the following inventions.

[1] A method for producing a substrate having through-silicon vias, the method comprising:
  a preparation step of preparing a silicon substrate including a silicon wafer provided with through-holes, the silicon substrate having the through-holes communicating with both principal surfaces;
  a copper sintered body formation step of forming a copper sintered body having a porous structure such that the copper sintered body fills at least the through-holes;
  a resin impregnation step of impregnating the copper sintered body with a curable resin composition; and
  a resin curing step of curing the curable resin composition impregnated into the copper sintered body to form an electric conductor including the copper sintered body, the copper sintered body having pores filled with a resin cured product, and providing through-silicon vias in the through-holes.

[2] A method for producing a substrate having through-silicon vias, the method comprising:
  a preparation step of preparing a silicon substrate including a silicon wafer provided with non-through-holes, the silicon substrate having the non-through-holes opened at one principal surface;
  a copper sintered body formation step of forming a copper sintered body having a porous structure such that the copper sintered body fills at least the non-through-holes;
  a resin impregnation step of impregnating the copper sintered body with a curable resin composition;
  a resin curing step of curing the curable resin composition impregnated into the copper sintered body to form an electric conductor including the copper sintered body, the copper sintered body having pores filled with a resin cured product; and
  a grinding step of grinding a surface of the silicon substrate having the electric conductor formed therein, the surface being on the opposite side of the surface having the non-through-holes opened thereon, to provide through-silicon vias.

[3] The method according to [1] or [2], wherein the filling ratio of the resin cured product in the electric conductor is 80% by volume or more based on the volume of the internal space of the pores.

[4] The method according to any one of [1] to [3], wherein the porosity of the copper sintered body is 1% to 15% by volume based on the volume of the copper sintered body.

[5] The method according to any one of [1] to [4], wherein in the copper sintered body formation step, the copper sintered body is formed so as to cover at least a portion of the principal surfaces of the silicon substrate.

[6] The method according to [5], further comprising an electric conductor removal step of removing at least a portion of the electric conductor formed on the principal surfaces of the silicon substrate.

[7] The method according to [6], wherein the removing means for the electric conductor removal step is one or more selected from the group consisting of etching, mechanical polishing, and chemical mechanical polishing.

[8] The method according to any one of [1] to [7], wherein the silicon substrate includes a metal coating film provided at least on the wall surfaces of the through-holes.

[9] The method according to any one of [1] to [8], wherein the ratio L/D of the length L to the hole diameter D of the through-silicon vias is 10 or more.

[10] The method according to any one of [1] to [9], wherein the copper sintered body formation step includes:
  a copper paste filling step of filling the through-holes of the silicon substrate with a copper paste including copper particles; and
  a copper paste calcining step of calcining the copper paste to form the copper sintered body.

[11] The method according to [10], wherein the copper paste includes, as the copper particles, first copper particles having a particle size of 0.8 μm or more and second copper particles having a particle size of 0.5 μm or less.

[12] The method according to [11], wherein the first copper particles have a flat shape.

[13] The method according to any one of [10] to [12], wherein the copper paste is calcined at an added pressure of 0.1 MPa or higher.

[14] The method according to any one of [10] to [13], wherein the copper paste is calcined in an atmosphere including nitrogen or hydrogen.

[15] A substrate having through-silicon vias, the substrate comprising:
  a silicon substrate including a silicon wafer provided with through-holes, the silicon substrate having the through-holes communicating with both principal surfaces; and
  through-silicon vias formed from an electric conductor filled in the through-holes,
  wherein the electric conductor includes a copper sintered body having a porous structure; and a resin cured product filling the pores of the copper sintered body.

[16] The substrate having through-silicon vias according to [15], wherein the filling ratio of the resin cured product in the electric conductor is 80% by volume or more based on the volume of the internal space of the pores.

[17] The substrate having through-silicon vias according to [15] or [16], wherein the silicon substrate includes a metal coating film provided at least on the wall surfaces of the through-holes.

[18] The substrate having through-silicon vias according to any one of [15] to [17], wherein the ratio L/D of the length L to the hole diameter D of the through-silicon vias is 10 or more.

[19] The substrate having through-silicon vias according to any one of [15] to [18], wherein the electric conductor covers at least a portion of the principal surfaces of the silicon substrate.

[20] A copper paste for through-silicon via formation, the copper paste being used for forming through-silicon vias and including first copper particles having a particle size of 0.8 μm or more and second copper particles having a particle size of 0.5 μm or less.

[21] The copper paste according to [20], wherein the first copper particles have a flat shape.

Advantageous Effects of Invention

According to an aspect of the present invention, there are provided a method for producing a substrate having through-silicon vias with high productivity, the substrate having sufficiently electrical conductivity as well as excellent connection reliability; a substrate having through-silicon vias, the substrate having sufficient electrical conductivity as well as excellent connection reliability; and a copper paste for through-silicon via formation used for forming through-silicon vias.

According to the above-described method, a substrate having through-silicon vias, the substrate having excellent airtightness and non-penetrability (characteristic that a liquid does not infiltrate), can be provided.

DESCRIPTION OF EMBODIMENTS

Figure 1:
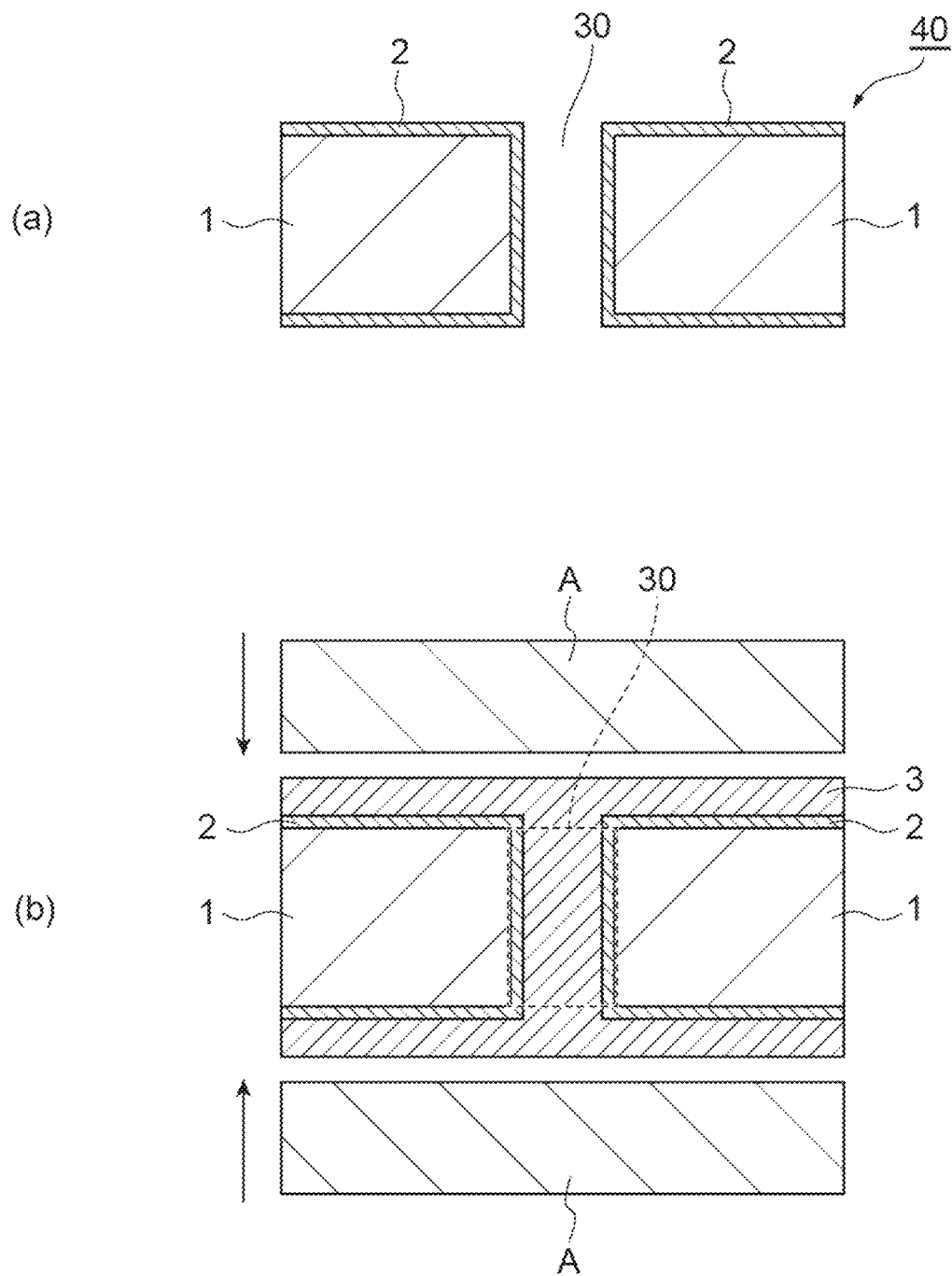
FIG. 1 is schematic diagrams illustrating a method for producing a substrate having through-silicon vias according to a first embodiment.
Figure 2:
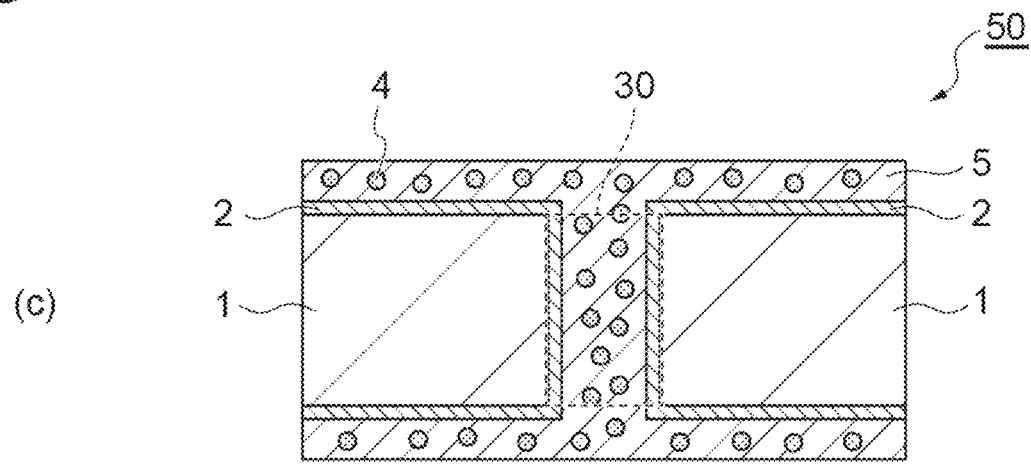
FIG. 2 is schematic diagrams illustrating the method for producing a substrate having through-silicon vias according to the first embodiment.
Figure 2:
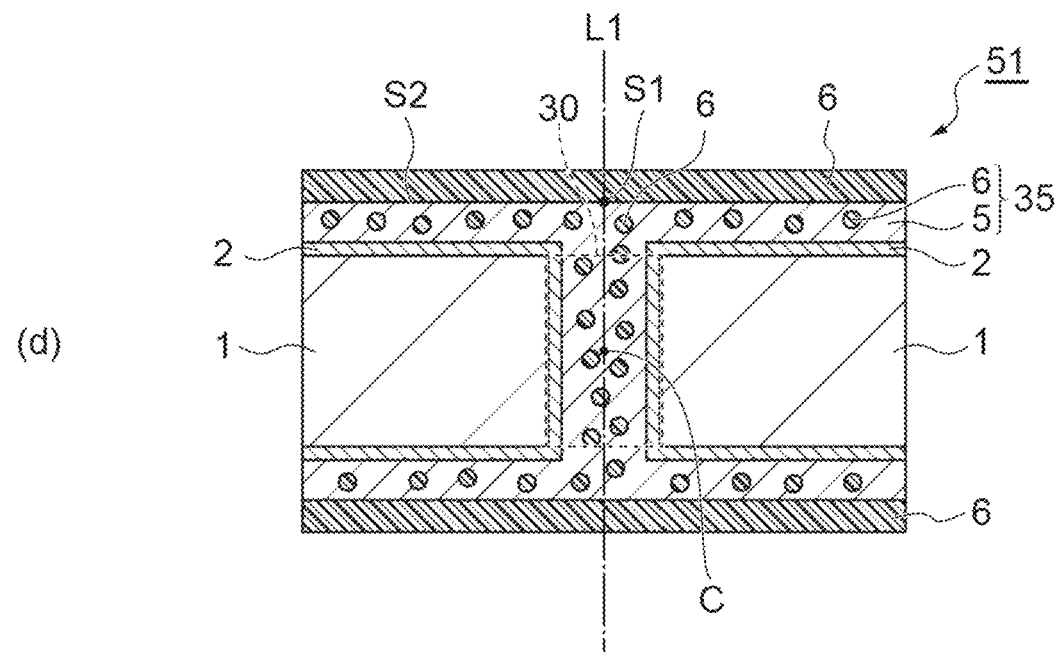

In the following description, embodiments for carrying out the present invention will be described in detail with reference to the drawings. The present invention is not intended to be limited to the following embodiments. Incidentally, the same reference symbol will be assigned to the same or equivalent parts in the drawings, and any overlapping description will not be repeated.

(Method for Producing Substrate Having Through-Silicon Vias According to First Embodiment)

FIG. 1 to FIG. 4 are schematic diagrams illustrating a method for producing a substrate having through-silicon vias according to a first embodiment.

The method for producing a substrate having through-silicon vias (hereinafter, may be referred to as through-silicon via substrate) according to the first embodiment comprises:

- a preparation step of preparing a silicon substrate including a silicon wafer provided with through-holes, the silicon substrate having the through-holes communicating with both principal surfaces;
- a copper sintered body formation step of forming a copper sintered body having a porous structure such that the copper sintered body fills at least the through-holes;
- a resin impregnation step of impregnating the copper sintered body with a curable resin composition; and
- a resin curing step of curing the curable resin composition impregnated into the copper sintered body to form an electric conductor that includes the copper sintered body having pores filled with a resin cured product, and providing through-silicon vias in the through-holes.

<Preparation Step for Silicon Substrate>

In this step, as shown in FIG. 1(a), a silicon substrate 40 having a silicon wafer 1 provided with through-holes 30; and a metal coating film 2 provided on the wall surfaces of the through-holes and the surface of the silicon wafer 1, can be prepared. The through-holes 30 communicate with both principal surfaces of the silicon substrate 40.

The thickness of the silicon wafer 1 may be 100 μm or more, 200 μm or more, or 300 μm or more, from the viewpoint of suppressing warpage of the substrate after sintering, and the thickness may be 800 μm or less, 300 μm or less, 200 μm or less, or 100 μm or less, from the viewpoint of weight reduction and density increase of the substrate.

The upper limit value of the hole diameter of the through-holes 30 may be 200 μm or less, 100 μm or less, or 60 μm or less, from the viewpoint of promoting an increase in the density of the obtainable semiconductor device, and although not particularly limited, the lower limit value of the hole diameter of the through-holes 30 may be 20 μm or more or may be 50 μm or more.

The number of the through-holes 30 provided in the silicon substrate 40 may be 100 or more, or 300 or more, per 1 $cm^2$ of the principal surfaces of the substrate, from the viewpoint of promoting an increase in the density of the obtainable semiconductor device.

The metal coating film 2 may be provided on both principal surfaces of the silicon wafer 1 and the wall surfaces of the through-holes 30, may be provided on at least one principal surface of the silicon wafer 1 and the wall surfaces of the through-holes 30, may be provided only on the wall surfaces of the through-holes 30, or may not be provided. According to the embodiment shown in FIG. 1(a), the silicon substrate 40 comprises the metal coating film 2 on both principal surfaces of the silicon wafer 1 and the wall surfaces of the through-holes 30.

Examples of the metal coating film 2 include titanium, nickel, chromium, copper, aluminum, palladium, platinum, and gold. From the viewpoint of close adhesiveness, the metal coating film 2 is preferably a coating film obtained by forming layers of titanium, nickel, and copper in this order. Adhesiveness is enhanced by oxidizing the surface of the silicon wafer 1 to produce silicon oxide and forming a titanium layer on the silicon oxide. Furthermore, when a nickel layer is provided on the titanium layer, and a copper layer is provided thereon, copper can be suppressed from diffusing into the silicon wafer 1, as compared to the case of providing a copper layer directly on the titanium layer. In addition, when a copper layer is provided on the surface, the adhesiveness between the silicon substrate 40 and the copper sintered body formed in the copper sintered body formation step that will be described below is enhanced.

<Copper Sintered Body Formation Step>

In this step, a copper sintered body having a porous structure is formed such that the copper sintered body fills at least the through-holes. According to the present embodiment, the copper sintered body may be formed so as to cover at least a portion on the principal surfaces of the silicon substrate 40. In this case, an electric conductor that fills the through-holes of the silicon substrate 40 can be formed, and at the same time, the electric conductor can also be provided on the principal surfaces of the silicon substrate 40. The electric conductor provided on the principal surfaces of the silicon substrate 40 can form wiring and through-silicon vias.

The copper sintered body formation step may have a copper paste filling step of filling the through-holes of the silicon substrate with a copper paste including copper particles; and a copper paste calcination step of calcining the copper paste to form the above-described copper sintered body. When the copper sintered body is formed on the principal surfaces of the silicon substrate, a layer of the copper paste can also be provided on both principal surfaces of the silicon during the copper paste filling step or thereafter.

Regarding the above-described copper sintered body formation step, for example, as shown in FIG. 1(b), a copper paste 3 including copper particles is applied on a silicon substrate 40, the copper paste 3 is filled into the through-holes 30, and at the same time, a layer of the copper paste 3 can be provided even on both principal surfaces of the silicon substrate 40. The details of the copper paste 3 will be described below.

Examples of the method of applying the copper paste 3 on the silicon substrate 40 include methods of applying using screen printing, transfer printing, offset printing, a jet printing method, a dispenser, a jet dispenser, a needle dispenser, a comma coater, a slit coater, a die coater, a gravure coater, slit coating, letterpress coating, intaglio printing, gravure printing, stencil printing, soft lithography, bar coating, an applicator, a particle deposition method, a spray coater, a spin coater, a dip coater, and the like.

When the copper paste is also applied on the principal surfaces of the silicon substrate, the thickness of the copper paste layer may be 1 μm or more, 2 μm or more, 3 μm or more, 5 μm or more, 10 μm or more, 15 μm or more, or 20 μm or more, and may be 300 μm or less, 250 μm or less, 200 μm or less, 150 μm or less, 120 μm or less, 100 μm or less, 80 μm or less, or 50 μm or less.

The copper paste 3 may be appropriately dried from the viewpoint that the copper particles flow during sintering of the copper paste 3 and that void generation in the copper sintered body is suppressed. When the copper paste 3 is dried, the atmosphere at the time of drying may be an oxygen-free atmosphere of nitrogen, noble gases, and the like, or may be a reducing atmosphere of hydrogen, formic acid, and the like.

Regarding the drying method, the copper paste may be dried by leaving the copper paste to stand at normal temperature, may be dried by heating, or may be dried under reduced pressure. For drying by heating or drying under reduced pressure, for example, a hot plate, a hot air dryer, a hot air heating furnace, a nitrogen dryer, an infrared dryer, an infrared heating furnace, a far-infrared heating furnace, a microwave heating apparatus, a laser heating apparatus, an electronic heating apparatus, a heater heating apparatus, a steam heating furnace, a hot plate pressing apparatus, and the like can be used. The temperature and time for drying may be appropriately adjusted in accordance with the type and amount of the dispersing medium used. The drying temperature may be, for example, 50° C. or higher and may be 180° C. or lower. The drying time may be, for example 1 minute or more and may be 120 minutes or less.

After the copper paste filling step, the copper particles included in the copper paste 3 are sintered by calcining the copper paste 3. In this manner, as shown in FIG. 2(c), a copper sintered body-filled silicon substrate 50 in which a copper sintered body 5 including pores 4, that is, having a porous structure, fills the through-holes 30 is obtained. According to the present embodiment, a copper sintered body-filled silicon substrate 50 in which the copper sintered body 5 is provided even on both principal surfaces of a silicon substrate 40 is obtained. The details of the copper sintered body 5 to be formed will be described below.

Calcination can be carried out by a heating treatment. For the heating treatment, for example, heating means such as a hot plate, a hot air dryer, a hot air heating furnace, a nitrogen dryer, an infrared dryer, an infrared heating furnace, a far-infrared heating furnace, a microwave heating apparatus, a laser heating apparatus, an electronic heating apparatus, a heater heating apparatus, and a steam heating furnace can be used.

The atmosphere at the time of calcination is preferably an oxygen-free atmosphere from the viewpoint of suppressing oxidation of the copper sintered body, and a reducing atmosphere is more preferred from the viewpoint of removing the surface oxide of the copper particles in the copper paste 3. Regarding the oxygen-free atmosphere, for example, introduction of an oxygen-free gas such as nitrogen or a noble gas, or a vacuum may be used. Examples of the reducing atmosphere include atmospheres in pure hydrogen gas, in a mixed gas of hydrogen and nitrogen, which is represented by forming gas, in nitrogen including formic acid gas, in a mixed gas of hydrogen and a noble gas, and in a noble gas including formic acid gas. When the copper paste 3 is sintered by heating without applying pressure as will be described below, an atmosphere in pure hydrogen gas or in a mixed gas of hydrogen and nitrogen, which is represented by forming gas, is preferred, and an atmosphere in pure hydrogen gas is more preferred. By heating in pure hydrogen gas, the sintering temperature of the copper particles can be lowered. When pure hydrogen gas is used, even if the thickness of the substrate is as thick as 600 μm, and the diameter of the through-holes is a diameter as fine as 10 μm, gas reaches to the center part of the through-holes 30, and the copper sintered body 5 is easily obtained.

From the viewpoint of reducing heat damage to each member and enhancing the product yield, the maximum attained temperature at the time of the heating treatment may be 150° C. or higher and may be 350° C. or lower, 300° C. or lower, or 260° C. or lower. When the maximum attained temperature is 150° C. or higher, sintering tends to proceed sufficiently as long as the maximum attained temperature retention temperature is 60 minutes or less. From the viewpoint of volatilizing all the dispersing medium and enhancing the product yield, the maximum attained temperature retention time may be 1 minute or more and may be 60 minutes or less, 40 minutes or less, or 30 minutes or less.

Calcination of the copper paste may be carried out in a state that pressure has been applied. In this case, in an atmosphere including pure hydrogen gas, the pressure may be 0.05 MPa or more, 0.1 MPa or more, or 0.3 MPa, and may be 20 MPa or less, 15 MPa or less, or 10 MPa or less. Furthermore, in an atmosphere including nitrogen, the pressure may be 1 MPa or more, or 3 MPa, and may be 20 MPa or less, 15 MPa or less, or 10 MPa or less.

By setting the pressure to 0.05 MPa or more in the case of using pure hydrogen gas and to 1 MPa or more in the case of using nitrogen gas, the generation of voids in the copper sintered body 5 formed at the center part of the through-holes 30 is easily suppressed, and a copper sintered body having satisfactory conduction characteristics is likely to be obtained. Furthermore, by setting the pressure to be equal to or more than the above-described lower limit value, when the silicon substrate 40 has the metal coating film 2, the joining strength between the metal coating film 2 and the copper sintered body 5 is easily enhanced. In addition, as shown in FIG. 1(b), when a silicon substrate 40 provided with a copper paste layer is pressurized by interposing the silicon substrate 40 between upper and lower pressurizing jigs A, the surface of the copper sintered body formed on the principal surfaces of the silicon substrate 40 is easily made smooth by setting the pressure applied to the pressurizing jigs A to be equal to or more than the above-described lower limit value. When the surface of the copper sintered body is smooth, there is an advantage that it is easy to form a fine wiring when wiring is formed by etching or the like in subsequent steps. The pressurizing jigs A are not particularly limited; however, commercially available pressurizing jigs may be used, and pressurizing jigs can also be produced using metal members having flat portions. For example, in pressurizing jigs having two or more of the above-described metal members, when a silicon substrate is interposed between the metal members that are disposed such that the flat portions face each other, the silicon substrate can be pressurized. The pressurizing jigs A may have a mechanism for adjusting the pressure to be applied to the silicon substrate. As pressure adjusting means, a spring or the like can be used.

When the pressure is 20 MPa or less, it is easier to suppress warpage of the silicon substrate 40. The reason why such an effect is obtained is considered as follows by the present inventors. First, it is speculated that when pressure is increased, the sintered density (particularly, the degree of denseness on the side in contact with the pressurizing jigs A) of the copper paste increases, and the coefficient of thermal expansion of the copper sintered body thus formed becomes close to the general coefficient of thermal expansion 16.5 μm/(m·K) at 25° C. of copper. On the other hand, the coefficient of thermal expansion at 25° C. of silicon is 2.6 μm/(m·K). Therefore, it is speculated that as the degree of denseness of the copper sintered body increases, the difference in the coefficient of thermal expansion between the copper sintered body and silicon increases, and warpage is likely to occur. According to the present embodiment, it is speculated that when the pressure is adjusted to 20 MPa or less, an increase in the degree of denseness of the copper sintered body is appropriately suppressed, and as a result, the difference in the coefficient of thermal expansion between the copper sintered body and silicon becomes smaller, so that warpage is suppressed.

When the pressure received at the time of calcination is in the above-described range, since a special pressurizing apparatus is unnecessary, reduction of voids, and the joining strength and connection reliability can be further enhanced. Regarding the method of applying pressure to the silicon substrate having the copper paste applied thereon, for example, a method of placing a weight, a method of pressurizing by using a pressurizing apparatus, and a method of pressurizing by using a fixing jig for pressurizing may be mentioned.

From the viewpoint of decreasing the volume resistivity of the copper sintered body, the porosity of the copper sintered body formed on the principal surfaces of the silicon substrate may be 15% by volume or less, 14% by volume or less, 12% by volume or less, or 9% by volume or less, based on the total volume including the porous structure of the copper sintered body. Furthermore, the porosity of the copper sintered body 5 may be 1% by volume or more, 3% by volume or more, or 5% by volume or more, from the viewpoint that cracking and warpage of the silicon substrate 40 can be suppressed.

As the copper sintered body formed on the principal surface of the silicon substrate has the above-described porous structure, the coefficient of thermal expansion can be decreased, the difference in the coefficient of thermal expansion between the copper sintered body and the silicon wafer can be reduced, and cracking and warpage of the silicon substrate can be suppressed.

From the viewpoint of decreasing the volume resistivity of the copper sintered body, the porosity of the copper sintered body filled in the through-holes may be 15% by volume or less, 14% by volume or less, 12% by volume or less, or 9% by volume or less, based on the total volume including the porous structure of the copper sintered body. Furthermore, from the viewpoint that the stress applied to the copper sintered body can be relieved, and cracking and warpage of the silicon substrate can be suppressed, the porosity of the copper sintered body 5 may be 1% by volume or more, 3% by volume or more, or 5% by volume or more.

When the copper sintered body filled in the through-holes has the above-described porous structure, the stress applied to the copper sintered body can be relieved, and cracking and warpage of the silicon substrate can be suppressed.

Incidentally, the porosity of the copper sintered body is calculated by the following procedure.

(i) A cross-section of a copper sintered body of a copper sintered body-filled silicon substrate (cut plane in the thickness direction of the substrate) is exposed by a focused ion beam.

(ii) A cross-section image of the exposed cross-section (area of 10 μm in the thickness direction of the substrate and 10 μm in a direction orthogonally intersecting the thickness direction of the substrate) is captured by a scanning electron microscope.

(iii) The obtained cross-section image is subjected to a binarization treatment so as to divide a sintered copper portion and a porous portion.

(iv) From the binarization treated cross-section image, the ratio of the area of the porous portion with respect to the total area of the copper sintered body cross-section is defined as the porosity of the copper sintered body.

In the case of calculating the porosity of the copper sintered body filled in the through-holes, with regard to the above-described (i), a cross-section at the center part of the copper sintered body filled in the through-holes is exposed. In the case of calculating the porosity at the center part of the copper sintered body filled in the through-holes, an area measuring ±5 μm in the thickness direction of the substrate and ±5 μm in a direction orthogonally intersecting the thickness direction of the substrate from the center part of the copper sintered body filled in the through-holes is observed. In the case of calculating the porosity of the copper sintered body formed on a principal surface of the copper sintered body-filled silicon substrate, with regard to the above-described (i), a cross-section of the copper sintered body on the principal surface is exposed. In the case of calculating the porosity of the copper sintered body formed on the principal surfaces of the copper sintered body-filled silicon substrate, a region extending from the surface of the copper sintered body formed on the principal surface to 5 μm is observed.

At the time of calculating the porosity of the copper sintered body used for the calculation of the filling ratio of the resin cured product in the electric conductor that will be described below, the site of observation of the copper sintered body can be appropriately set to be the same site as the site of observation of the electric conductor.

Furthermore, when the pressure received at the time of calcination is in the above-described range, since a special pressurizing apparatus is unnecessary, reduction of voids, and the joining strength and connection reliability can be further enhanced. Regarding the method of applying pressure to the silicon substrate having the copper paste applied thereon, for example, a method of placing a weight, a method of pressurizing by using a pressurizing apparatus, and a method of pressurizing by using a fixing jig for pressurizing may be mentioned.

With regard to the copper sintered body, the proportion of copper element in the elements excluding light elements among the constituting elements may be 95% by mass or more, may be 97% by mass or more, may be 98% by mass or more, or may be 100% by mass. When the above-described proportion of copper element in the copper sintered body is in the above-described range, formation of an intermetallic compound or precipitation of heteroelements in the metal-copper crystal grain boundaries can be suppressed, the properties of the metal copper constituting the copper sintered body are likely to be strong, and superior connection reliability is likely to be obtained.

In the copper sintered body formation step, the copper paste may be calcined by heating without pressurizing the copper paste. In this case, the porosity of the copper sintered body formed on the principal surfaces of the silicon substrate tends to become large, and when the coefficient of thermal expansion of the copper sintered body is decreased, cracking and warpage of the silicon substrate is not likely to occur.

<Resin Impregnation Step>

In this step, for example, when a curable resin composition is applied on the copper sintered body-filled silicon substrate 50 obtainable by the copper sintered body formation step, the copper sintered body 5 can be impregnated with the curable resin composition. In the present embodiment, the copper sintered body 5 filled in the through-holes 30 and the copper sintered body 5 formed on both principal surfaces of the silicon substrate 40 are impregnated with the curable resin composition. Meanwhile, it is preferable that the pores 4 of the copper sintered body 5 are sufficiently filled with the impregnated curable resin composition.

(Curable Resin Composition)

The component constituting the curable resin composition may be a thermosetting compound. Examples of the thermosetting compound include an oxetane compound, an epoxy compound, an episulfide compound, a (meth)acrylic compound, a phenol compound, an amino compound, an unsaturated polyester compound, a polyurethane compound, a silicone compound, and a polyimide compound. Among them, the thermosetting compound may be an epoxy compound from the viewpoint of making the curability and viscosity of the curable resin composition further satisfactory and enhancing the characteristics for standing at a high temperature and insulation reliability.

The curable resin composition may further include a thermosetting agent. Examples of the thermosetting agent include an imidazole curing agent, an amine curing agent, a phenol curing agent, a polythiol curing agent, an acid anhydride a thermal cationic initiator, and a thermal radical generator. One kind of these may be used alone, or two or more kinds thereof may be used in combination. Among these, from the viewpoint that rapid curing at a low temperature is enabled, an imidazole curing agent, a polythiol curing agent, or an amine curing agent is preferred. Furthermore, from the viewpoint that storage stability is increased when a thermosetting compound and a thermosetting agent are mixed, a latent curing agent is preferred. The latent curing agent is preferably a latent imidazole curing agent, a latent polythiol curing agent, or a latent amine curing agent. Incidentally, the thermosetting agent may be coated with a polymer substance such as a polyurethane resin or a polyester resin.

The imidazole curing agent is not particularly limited, and examples include 2-methylimidazole, 2-ethyl-4-methylimidazole, 1-cyanoethyl-2-phenylimidazole, 1-cyanoethyl-2-phenylimidazolium trimellitate, 2,4-diamino-6-[2'-methylimidazolyl-(1')]-ethyl-s-triazine, and 2,4-diamino-6-[2'-methylimidazolyl-(1')]-ethyl-s-triazine isocyanuric acid adduct.

The polythiol curing agent is not particularly limited, and examples include trimethylolpropane tris-3-mercaptopropionate, pentaerythritol tetrakis-3-mercaptopropionate, and dipentaerythritol hexa-3-mercaptopropionate. The solubility parameter of a polythiol curing agent is preferably 9.5 or more, and preferably 12 or less. The solubility parameter is calculated by the Fedors method. For example, the solubility parameter of trimethylolpropane tris-3-mercaptopropionate is 9.6, and the solubility parameter of dipentaerythritol hexa-3-mercaptopropionate is 11.4.

The amine curing agent is not particularly limited, and examples include hexamethylenediamine, octamethylenediamine, decamethylenediamine, 3,9-bis(3-aminopropyl)-2,4,8,10-tetraspiro [5.5]undecane, bis(4-aminocyclohexyl) methane, metaphenylenediamine, and diaminodiphenylsulfone.

Examples of the thermal cationic curing agent include an iodonium-based cationic curing agent, an oxonium-based cationic curing agent, and a sulfonium-based cationic curing agent. Examples of the iodonium-based cationic curing agent include bis(4-tert-butylphenyl)iodonium hexafluorophosphate. Examples of the oxonium-based cationic curing agent include trimethyloxonium tetrafluoroborate. Examples of the sulfonium-based cationic curing agent include tri-p-tolylsulfonium hexafluorophosphate.

The thermal radical generator is not particularly limited, and examples include an azo compound and an organic peroxide. Examples of the azo compound include azobisisobutyronitrile (AIBN). Examples of the organic peroxide include di-tert-butyl peroxide and methyl ethyl ketone peroxide.

Examples of the method of applying the curable resin composition include methods of applying by screen printing, transfer printing, offset printing, a jet printing method, a dispenser, a jet dispenser, a needle dispenser, a comma coater, a slit coater, a die coater, a gravure coater, a slit coater, letterpress printing, intaglio printing, gravure printing, stencil printing, soft lithography, bar coating, an applicator, a particle disposition method, a spray coater, a spin coater, and a dip coater.

The curable resin composition may be applied on one principal surface of the copper sintered body-filled silicon substrate 50 or may be applied on a portion on the principal surface. When the resin composition is applied on both surfaces of the copper sintered body-filled silicon substrate 50, the resin composition is applied on one principal surface of the copper sintered body-filled silicon substrate 50, the resin composition is caused to penetrate to the principal surface side of the copper sintered body-filled silicon substrate 50, where the resin composition was not applied, and then the resin composition may be applied on the principal surface where the resin composition is not applied. As a result, the resin composition can be made spread all over the pores 4.

When the copper sintered body-filled silicon substrate 50 having a curable resin composition applied thereon is left to stand in a reduced pressure environment, the impregnation properties of the curable resin composition into the pores 4 of the copper sintered body 5 can be enhanced.

In the resin impregnation step, it is preferable that the copper sintered body is impregnated with the cured resin composition such that the filling ratio of a resin cured product in the electric conductor formed by a resin curing step is in the preferred range that will be described below.

<Resin Curing Step>

In this step, as shown in FIG. 2(d), as the curable resin composition impregnated into the copper sintered body 5 (curable resin composition filled in the pores 4) is cured, an electric conductor 35 that includes the copper sintered body 5 having a resin cured product 6 filled in the pores 4 is formed, and a substrate 51 having through-silicon vias, in which through-silicon vias are provided in the through-holes 30, can be obtained. In the case of the present embodiment, an electric conductor 35 that includes the copper sintered body 5 having the resin cured product 6 filled in the pores 4 is provided even on both principal surfaces of the silicon substrate 40.

Curing of the curable resin composition can be carried out by a heating treatment. For the heating treatment, heating means such as a hot plate, a hot air dryer, a hot air heating furnace, a nitrogen dryer, an infrared dryer, an infrared heating furnace, a far-infrared heating furnace, a microwave heating apparatus, a laser heating apparatus, an electronic heating apparatus, a heater heating apparatus, and a steam heating furnace can be used.

The atmosphere in the resin curing step may be an oxygen-free atmosphere from the viewpoint of suppressing oxidation of the copper sintered body 5, or may be a reducing atmosphere from the viewpoint of removing the surface oxide of the copper sintered body 5. Examples of the oxygen-free atmosphere include introduction of an oxygen-free gas such as nitrogen or a noble gas, or a vacuum. Examples of the reducing atmosphere include atmospheres in pure hydrogen gas, in a mixed gas of hydrogen and nitrogen, which is represented by forming gas, in nitrogen including formic acid gas, in a mixed gas of hydrogen and a noble gas, and in a noble gas including formic acid gas.

The maximum attained temperature at the time of a heating treatment in the resin curing step may be 150° C. or higher and may be 350° C. or lower, 300° C. or lower, or 260° C. or lower, from the viewpoint of reducing the thermal damage to each member and enhancing the product yield. When the maximum attained temperature is 150° C. or higher, curing of the resin composition tends to proceed sufficiently in a case where the maximum attained temperature retention time is 60 minutes or less.

The electric conductor 35 formed in the resin curing step (electric conductor before an electric conductor removal step) may be such that the filling ratio of the resin cured product 6 satisfies the following conditions:

(Electric Conductor of Through-Hole)

(a) In a region extending from a spot S1, where a line L1 extending in the thickness direction of the substrate through the center part C of a through-hole 30 (center in the hole length and center in the hole diameter at the length center) intersects the surface of the electric conductor 35, to a depth of 10 μm, the filling ratio of the resin cured product may be 80% by volume or more, 90% by volume or more, or 95% by volume or more, based on the sum of the volumes of the internal spaces of the pores in the copper sintered body.

(b) In a region extending from the spot S1 to a depth of 10 to 20 μm, the filling ratio of the resin cured product may be 80% by volume or more, 90% by volume or more, or 95% by volume or more, based on the sum of the volumes of the internal spaces of the pores in the copper sintered body.

(c) In a region extending from the spot S1 to a depth of 20 to 30 μm, the filling ratio of the resin cured product may be 80% by volume or more, 90% by volume or more, or 95% by volume or more, based on the sum of the volumes of the internal spaces of the pores in the copper sintered body.

(d) In an area measuring ±5 μm in the thickness direction of the substrate and ±5 μm in a direction orthogonally intersecting the thickness direction of the substrate, both from the center part C of a through-hole 30, the filling ratio of the resin cured product may be 80% by volume or more, 90% by volume or more, or 95% by volume or more, based on the sum of the volumes of the internal spaces of the pores in the copper sintered body.

(Electric Conductor on Principal Surface of Substrate)

(e) In a region extending from a surface S2 of the electric conductor 35 formed on a principal surface of the substrate to a depth of 5 μm, the filling ratio of the resin cured product may be 80% by volume or more, 90% by volume or more, or 95% by volume or more, based on the sum of the volumes of the internal spaces of the pores 4 in the copper sintered body 5.

(f) In a region extending from the surface S2 of the electric conductor 35 formed on a principal surface of the substrate to a depth of 10 μm, the filling ratio of the resin cured product may be 80% by volume or more, 90% by volume or more, or 95% by volume or more, based on the sum of the volumes of the internal spaces of the pores 4 in the copper sintered body 5.

(g) In a region extending from the surface S2 to a depth of 10 to 20 μm, the filling ratio of the resin cured product may be 80% by volume or more, 90% by volume or more, or 95% by volume or more, based on the sum of the volumes of the internal spaces of the pores in the copper sintered body.

(h) In a region extending from the surface S2 to a depth of 20 to 30 μm, the filling ratio of the resin cured product may be 80% by volume or more, 90% by volume or more, or 95% by volume or more, based on the sum of the volumes of the internal spaces of the pores in the copper sintered body.

The filling ratio of the resin cured product 6 in the electric conductor 35 is calculated by the following procedure.

(i) A cross-section of an electric conductor of an electric conductor-filled silicon substrate (cut plane in the thickness direction of the substrate) is exposed by a focused ion beam.

(ii) A cross-section image of the exposed cross-section (area of 10 μm in the thickness direction of the substrate and 10 μm in a direction orthogonally intersecting the thickness direction of the substrate) is captured by a scanning electron microscope.

(iii) The obtained cross-section image is subjected to a binarization treatment so as to divide a sintered copper portion as well as a resin cured product portion and a porous portion that is not embedded by the resin cured product.

(iv) The ratio of the area of the porous portion that is not embedded by the resin cured product with respect to the total area of the electric conductor cross-section is determined from the binarization treated cross-section image, and this is defined as the porosity of the electric conductor from the binarized cross-section image.

(v) The filling ratio of the resin cured product in the electric conductor is calculated by inserting the porosity of the copper sintered body before being impregnated with the curable resin composition and the porosity of the electric conductor into the following Formula (1).

$$\text{Filling ratio (\%) of resin cured product in electric conductor} = [(B-A)/B] \times 100 \qquad \text{Formula (1)}$$

[wherein in Formula (1), A represents the porosity (%) of the electric conductor; and B represents the porosity (%) of the copper sintered body].

In the case of calculating the porosity of the electric conductor filled in the through-holes, with regard to the above-described (i), a cross-section of the center part of the electric conductor within the through-holes is exposed. In the case of calculating the porosity of the electric conductor formed on the principal surface of the electric conductor-filled silicon substrate, with regard to the above-described (i), a cross-section of the electric conductor on the principal surfaces is exposed.

<Electric Conductor Removal Step>

In this step, at least a portion of the electric conductor 35 formed on the principal surfaces of the silicon substrate 40 can be removed. Examples of the means for removing the electric conductor include chemical polishing, mechanical polishing, chemical mechanical polishing, a fly cutting treatment, and a plasma treatment. A fly cutting treatment means cutting flattening by a surface planer.

According to the present embodiment, regarding a general technique, from the viewpoint of being simply and easily applicable, it is preferable that the removal means is one or more selected from the group consisting of etching, mechanical polishing, and chemical mechanical polishing; however, the removal means is not limited to this.

As the method for producing a silicon substrate having through-silicon vias according to the present embodiment comprises an electric conductor removal step, for example, the surface of the electric conductor 35 formed on the principal surfaces of the silicon substrate 40 is flattened, and the formation of wiring is facilitated.

According to the present embodiment, the filling ratio of the resin cured product 6 in the electric conductor 35 after the electric conductor removal step may satisfy the following conditions. Incidentally, the filling ratio can be calculated as described above.

(Electric Conductor of Through-Hole)

(a) In a region extending from a spot S3, where a line L1 extending in the thickness direction of the substrate through the center part C of a through-hole 30 (center in the hole length and center in the hole diameter at the length center) intersects the surface of the electric conductor 35 to a depth of 10 μm, the filling ratio of the resin cured product may be 80% by volume or more, 90% by volume or more, or 95% by volume or more, based on the sum of the volumes of the internal spaces of the pores in the copper sintered body.

(b) In a region extending from the spot S3 to a depth of 10 to 20 μm, the filling ratio of the resin cured product may be 80% by volume or more, 90% by volume or more, or 95% by volume or more, based on the sum of the volumes of the internal spaces of the pores in the copper sintered body.

(c) In a region extending from the spot S3 to a depth of 20 to 30 μm, the filling ratio of the resin cured product may be 80% by volume or more, 90% by volume or more, or 95% by volume or more, based on the sum of the volumes of the internal spaces of the pores in the copper sintered body.

(d) In an area measuring ±5 μm in the thickness direction of the substrate and ±5 μm in a direction orthogonally intersecting the thickness direction of the substrate, both from the center part C of a through-hole 30, the filling ratio of the resin cured product may be 80% by volume or more, 90% by volume or more, or 95% by volume or more, based on the sum of the volumes of the internal spaces of the pores in the copper sintered body.

(Electric Conductor on Principal Surfaces of Substrate)

(e) In a region extending from a surface S4 of the electric conductor 35 formed on a principal surface of the substrate to a depth of 5 μm, the filling ratio of the resin cured product may be 80% by volume or more, 90% by volume or more, or 95% by volume or more, based on the sum of the volumes of the internal spaces of the pores 4 in the copper sintered body 5.

(f) In a region extending from the surface S4 of the electric conductor 35 formed on a principal surface of the substrate to a depth of 10 μm, the filling ratio of the resin cured product may be 80% by volume or more, 90% by volume or more, or 95% by volume or more, based on the sum of the volumes of the internal spaces of the pores 4 in the copper sintered body 5.

(g) In a region extending from the surface S4 to a depth of 10 to 20 μm, the filling ratio of the resin cured product may be 80% by volume or more, 90% by volume or more, or 95% by volume or more, based on the sum of the volumes of the internal spaces of the pores in the copper sintered body.

(h) In a region extending from the surface S4 to a depth of 20 to 30 μm, the filling ratio of the resin cured product may be 80% by volume or more, 90% by volume or more, or 95% by volume or more, based on the sum of the volumes of the internal spaces of the pores in the copper sintered body.

From the viewpoint of promoting an increase in the density of the obtainable semiconductor device, the ratio L/D of the length L to the hole diameter D of the through-silicon vias may be 1 or more, 5 or more, or 10 or more, and may be 15 or less, 10 or less, or 5 or less. The length L of the through-silicon vias may be the thickness of the substrate having through-silicon vias. In this case, the ratio T/D of the thickness T of the substrate having through-silicon vias with respect to the hole diameter D of the through-silicon vias may be in the above-described range.

The method for producing a substrate having through-silicon vias of the present embodiment may further comprise a wiring formation step. The wiring formation step can have a resist formation step, an etching step, and a resist removal step, all of which will be described below.

<Resist Formation Step>

Figure 3:
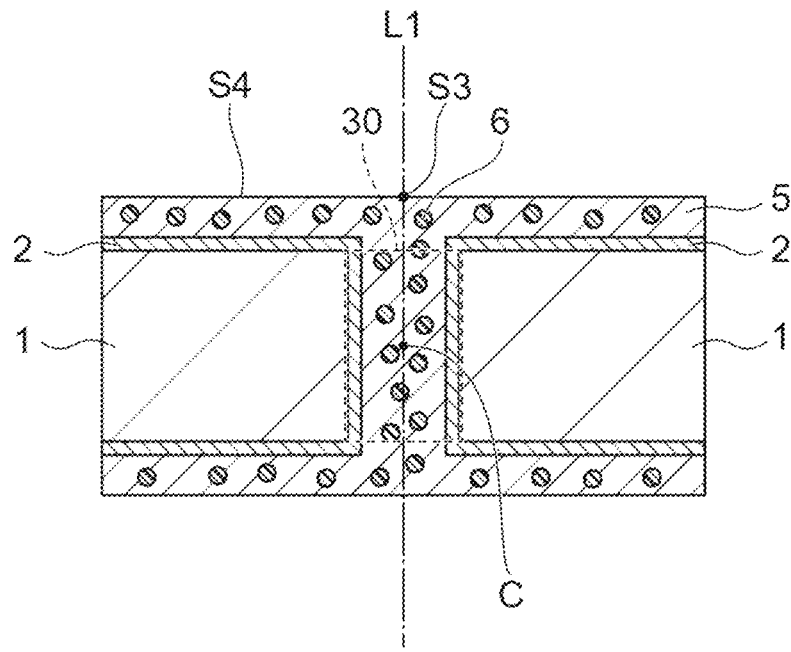
FIG. 3 is schematic diagrams illustrating the method for producing a substrate having through-silicon vias according to the first embodiment.
Figure 3:
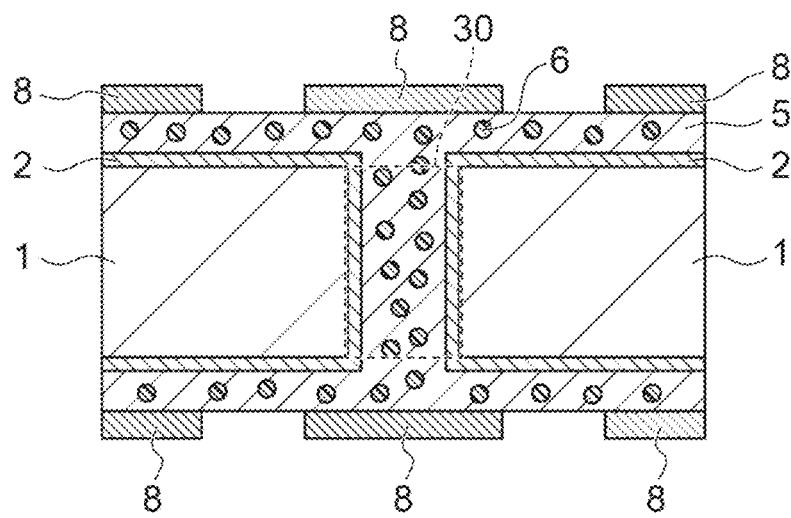

In the resist formation step, as shown in FIG. 3(*f*), an etching resist 8 is formed on then electric conductor 35 formed on the principal surfaces of the silicon substrate 40.

Regarding the method for forming an etching resist 8, for example, a method of silk screen printing a resist ink, or a method of laminating a negative-type photosensitive dry film for etching resist on a copper foil, stacking a photomask that transmits light in the wiring shape thereon, exposing the laminate to ultraviolet radiation, and removing the unexposed sites with a developer liquid, may be mentioned.

<Etching Step>

Figure 4:
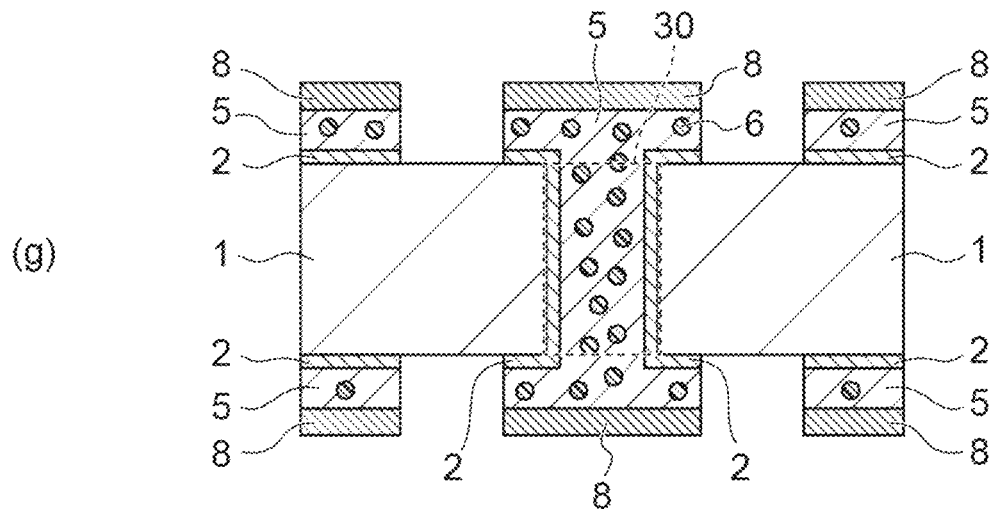
FIG. 4 is schematic diagrams illustrating the method for producing a substrate having through-silicon vias according to the first embodiment and a substrate having through-silicon vias according to the first embodiment.
Figure 4:
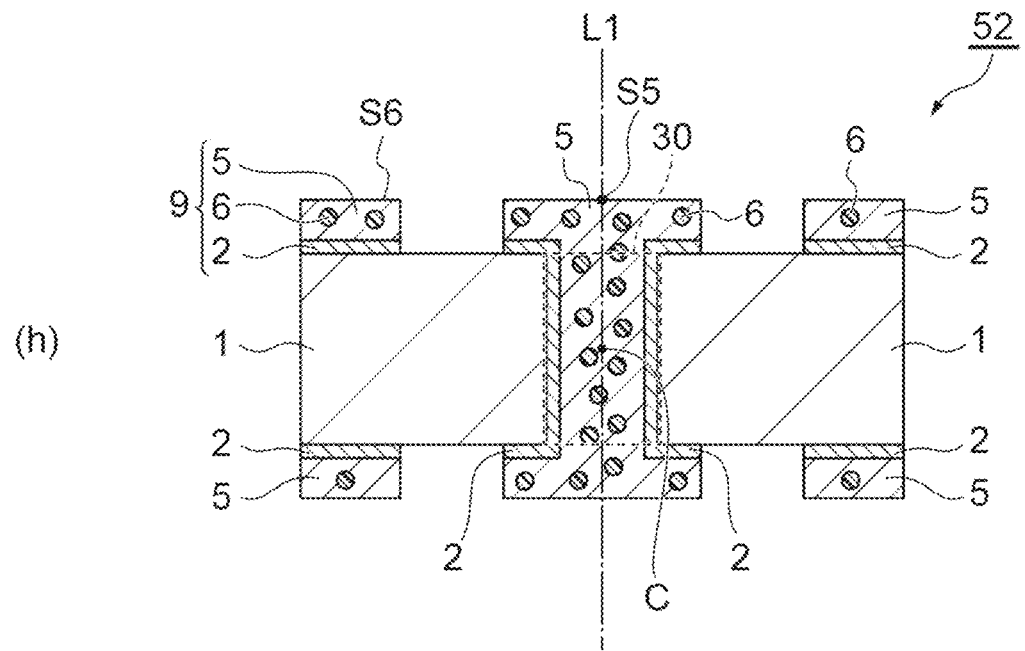

In the etching step, as shown in FIG. 4(*g*), the electric conductor 35 at a portion that is not covered by the etching resist 8 is removed by etching. According to the present embodiment, a portion of the metal coating film 2 provided on both principal surfaces of the silicon wafer 1 is removed by etching.

Regarding the method for etching, for example, a method of using a chemical etching solution that is used for conventional wiring boards, such as a solution of cupric chloride and hydrochloric acid, a ferric chloride solution, a solution of sulfuric acid and hydrogen peroxide, or an ammonium persulfate solution, may be mentioned.

<Resist Removal Step>

In the resist removal step, the etching resist 8 formed on the electric conductor 35 is removed.

As the method for producing a substrate having through-silicon vias according to the present embodiment further comprises the wiring formation step having the above-described above steps, a wiring 9 including the electric conductor 35 can be formed on the principal surfaces of the silicon substrate 40.

(Substrate Having Through-Silicon Vias According to First Embodiment)

FIG. 4(*h*) is a cross-sectional view illustrating an embodiment of the substrate having through-silicon vias, which can be produced by the method according to the above-mentioned first embodiment. The substrate 52 having through-silicon vias as shown in FIG. 4(*h*) comprises a silicon substrate 40 including a silicon wafer 1 provided with through-holes 30, the silicon substrate 40 having the through-holes 30 communicating with both principal surfaces; and an electric conductor 35 filled in the through-holes 30, and the electric conductor 35 includes a copper sintered body 5 having a porous structure; and a resin cured product 6 filled in the pores 4 of the copper sintered body 5.

The substrate 52 having through-silicon vias as shown in FIG. 4(*h*) has a metal coating film 2 provided on both principal surfaces of the silicon wafer 1 and the wall surfaces of the through-holes; however, the metal coating film 2 may not be provided on the principal surfaces, may be provided only on one principal surface, or may not be provided on the wall surfaces of the through-holes. Furthermore, the substrate 52 having through-silicon vias is provided with a wiring 9 including the metal coating film 2 and the electric conductor 35 on both principal surfaces of the silicon substrate 40; however, the wiring 9 may be provided on one principal surface of the silicon substrate 40.

The substrate 52 having through-silicon vias may be such that the filling ratio of the resin cured product 6 in the electric conductor 35 satisfies the following conditions. Incidentally, the filling ratio can be calculated as described above.

(Electric Conductor of Through-Hole)

(a) In a region extending from a spot S5, where a line L1 extending in the thickness direction of the substrate through the center part C of a through-hole 30 (center in the hole length and center in the hole diameter at the length center) intersects the surface of the electric conductor 35 to a depth of 10 μm, the filling ratio of the resin cured product may be 80% by volume or more, 90% by volume or more, or 95% by volume or more, based on the sum of the volumes of the internal spaces of the pores in the copper sintered body.

(b) In a region extending from the spot S5 to a depth of 10 to 20 μm, the filling ratio of the resin cured product may be 80% by volume or more, 90% by volume or more, or 95% by volume or more, based on the sum of the volumes of the internal spaces of the pores in the copper sintered body.

(c) In a region extending from the spot S5 to a depth of 20 to 30 μm, the filling ratio of the resin cured product may be 80% by volume or more, 90% by volume or more, or 95% by volume or more, based on the sum of the volumes of the internal spaces of the pores in the copper sintered body.

(d) In an area measuring ±5 μm in the thickness direction of the substrate and ±5 μm in a direction orthogonally intersecting the thickness direction of the substrate, both from the center part C of a through-hole 30, the filling ratio of the resin cured product may be 80% by volume or more, 90% by volume or more, or 95% by volume or more, based on the sum of the volumes of the internal spaces of the pores in the copper sintered body.

(Electric Conductor on Principal Surfaces of Substrate)

(e) In a region extending from a surface S6 of the electric conductor 35 formed on a principal surface of the substrate to a depth of 5 μm, the filling ratio of the resin cured product may be 80% by volume or more, 90% by volume or more, or 95% by volume or more, based on the sum of the volumes of the internal spaces of the pores 4 in the copper sintered body 5.

(f) In a region extending from the surface S6 of the electric conductor 35 formed on a principal surface of the substrate to a depth of 10 μm, the filling ratio of the resin cured product may be 80% by volume or more, 90% by volume or more, or 95% by volume or more, based on the sum of the volumes of the internal spaces of the pores 4 in the copper sintered body 5.

(g) In a region extending from the surface S6 to a depth of 10 to 20 μm, the filling ratio of the resin cured product may be 80% by volume or more, 90% by volume or more, or 95% by volume or more, based on the sum of the volumes of the internal spaces of the pores in the copper sintered body.

(h) In a region extending from the surface S6 to a depth of 20 to 30 μm, the filling ratio of the resin cured product may be 80% by volume or more, 90% by volume or more, or 95% by volume or more, based on the sum of the volumes of the internal spaces of the pores in the copper sintered body.

(Semiconductor Device According to First Embodiment)

Figure 5:
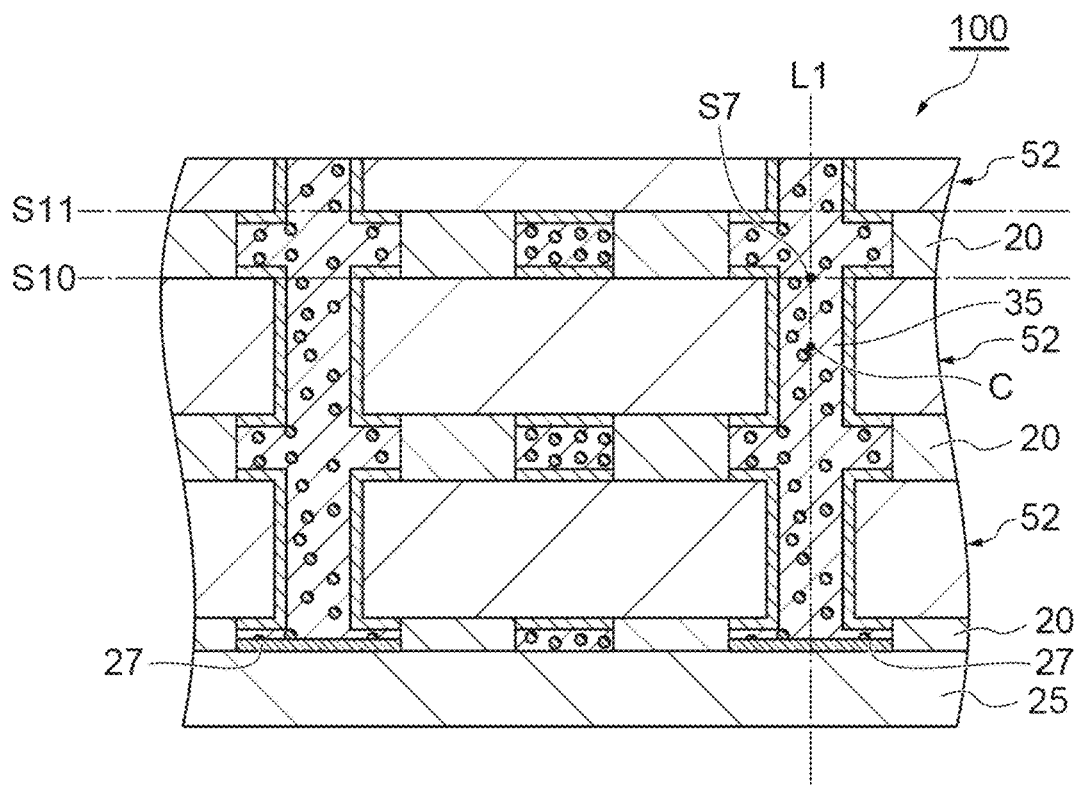
FIG. 5 is schematic diagrams illustrating a semiconductor device according to the first embodiment.
Figure 5:
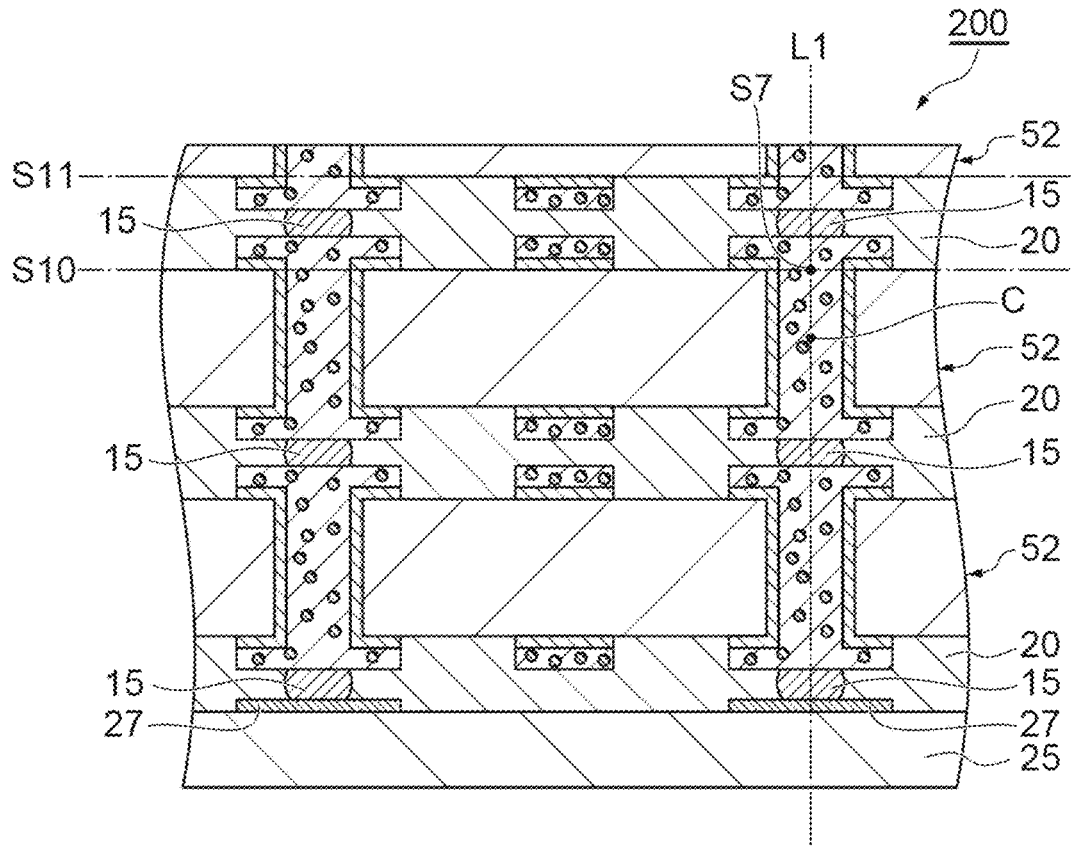

A semiconductor device produced using the substrate having through-silicon vias according to the first embodiment will be specifically described using FIG. 5. FIG. 5 is schematic cross-sections illustrating an embodiment of the semiconductor device of the present invention. The semiconductor device 100 shown in FIG. 5(*a*) is such that a wiring 27 on an interposer substrate 25 and an electric conductor 35 of a substrate 51 having through-silicon vias are directly connected, and thereby the interposer substrate 25 and the substrate 51 having through-silicon vias are flip-chip connected. The gap between the interposer substrate 25 and the substrate 51 having through-silicon vias is compactly filled with a cured product 20 of an adhesive and is sealed. On the principal surface on the opposite side of the interposer substrate 25 in the substrate 51 having through-silicon vias, the substrates 51 having through-silicon vias are repeatedly laminated. The substrates 51 having through-silicon vias are connected by an electric conductor 35. The gaps between the substrates 51 having through-silicon vias are compactly filled with a cured product 20 of an adhesive and are sealed.

The semiconductor device 100 may be obtained by, for example, the following method. That is, the substrates 51 having through-silicon vias are laminated by means of an adhesive, and a laminated body is obtained. The adhesive may be cured during lamination. The obtained laminated body and an interposer substrate 25 are pressure-bonded to be electrically connected, and a connector body in which the laminated body and the interposer substrate 25 are electrically connected is formed. A dicing tape is stuck to a surface of the formed connector body, the surface being on the opposite side of the surface where the interposer substrate 25 is provided, and dicing is performed along dicing lines to obtain the semiconductor device 100.

The semiconductor device 200 shown in FIG. 5(*b*) is such that a wiring 27 on an interposer substrate 25 and an electric conductor 35 of a substrate 51 having through-silicon vias are connected by means of fine bumps 15, and thereby the interposer substrate 25 and the substrate 51 having through-silicon vias are flip-chip connected. The gap between the interposer substrate 25 and the substrate 51 having through-silicon vias is compactly filled with a cured product 20 of an adhesive and is sealed. On the principal surface on the opposite side of the interposer substrate 25 in the substrate 51 having through-silicon vias, the substrates 51 having through-silicon vias are repeatedly laminated, with the fine bumps 15 interposed therebetween. The gaps between the substrates 51 having through-silicon vias are compactly filled with the cured product 20 of the adhesive and are sealed.

The semiconductor device 200 may be obtained by, for example, the following method. That is, substrates 51 having through-silicon vias provided with fine bumps 15 on one principal surface are laminated, with an adhesive interposed therebetween, to obtain a laminated body. The adhesive may be cured during lamination. The obtained laminated body and an interposer substrate 25 are pressure-bonded to be electrically connected, and a connector body in which the laminated body and the interposer substrate 25 are electrically connected is formed. A dicing tape is stuck to a surface of the formed connector body, the surface being on the opposite side of the surface where the interposer substrate 25 is provided, and dicing is performed along dicing lines to obtain the semiconductor device 200.

(Method for Producing Substrate Having Through-Silicon Vias According to Second Embodiment)

Figure 6:
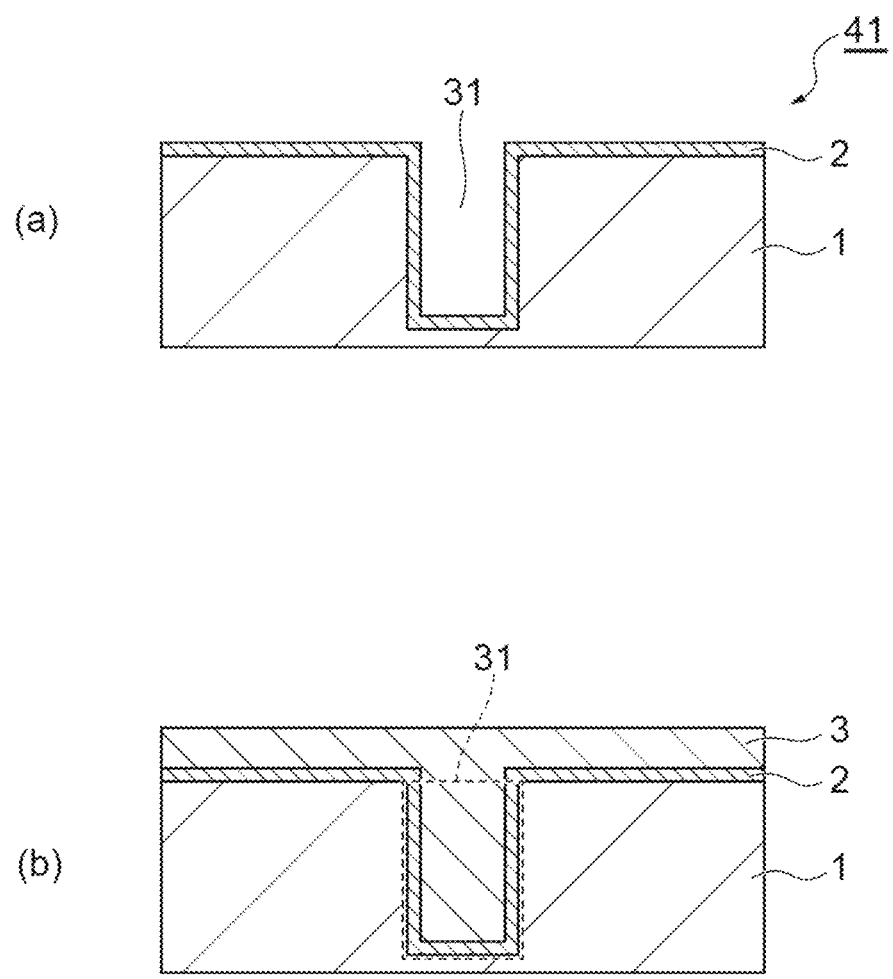
FIG. 6 is schematic diagrams illustrating a method for producing a substrate having through-silicon vias according to a second embodiment.
Figure 7:
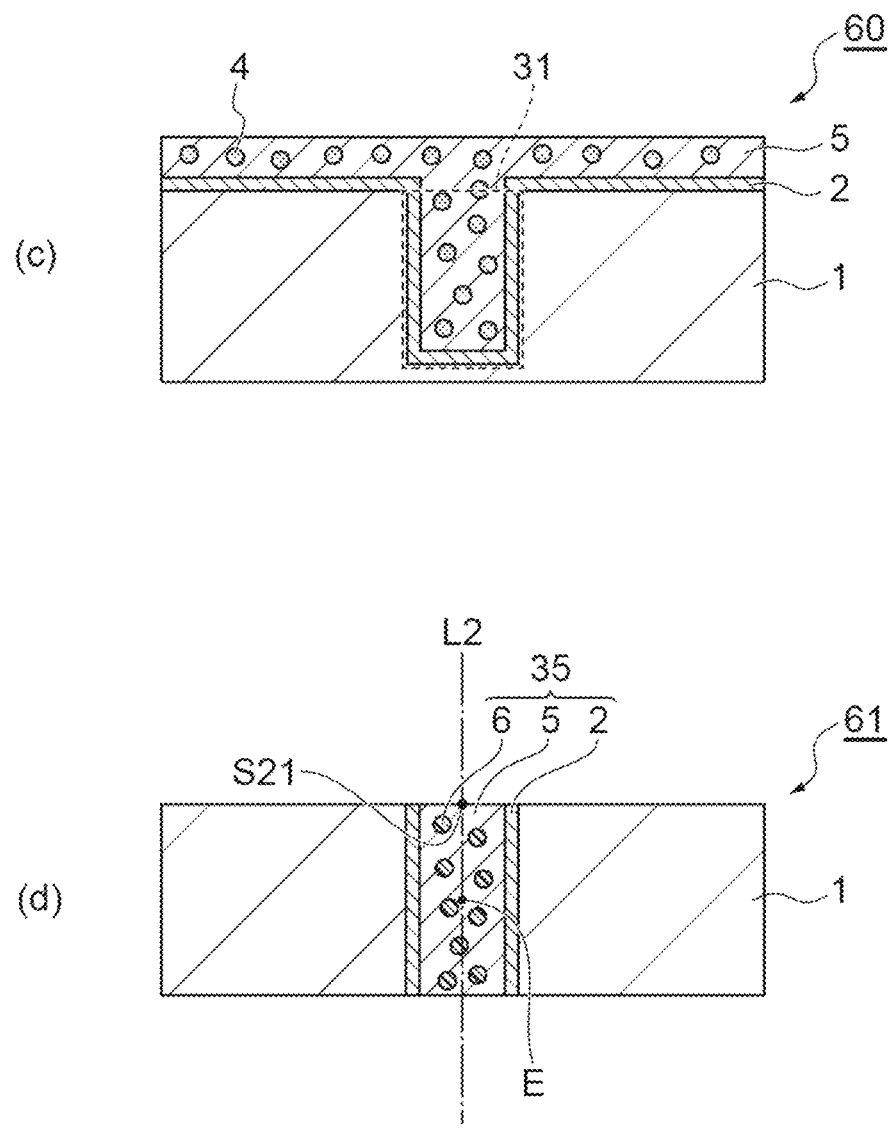
FIG. 7 is schematic diagrams illustrating the method for producing a substrate having through-silicon vias according to the second embodiment and a substrate having through-silicon vias according to the second embodiment.

FIG. 6 and FIG. 7 are schematic diagrams illustrating a method for producing a substrate having through-silicon vias according to a second embodiment.

The method for producing a substrate having through-silicon vias according to the second embodiment comprises:

- a preparation step of preparing a silicon substrate including a silicon wafer provided with non-through-holes, the silicon substrate having the non-through-holes opened at one principal surface;
- a copper sintered body formation step of forming a copper sintered body having a porous structure such that the copper sintered body fills at least the non-through-holes;
- a resin impregnation step of impregnating the copper sintered body with a curable resin composition;
- a resin curing step of curing the curable resin composition impregnated into the copper sintered body to form an electric conductor including the copper sintered body, the copper sintered body having pores filled with a resin cured product; and a grinding step of grinding a surface of the silicon substrate having the electric conductor formed therein, the surface being on the opposite side of the surface having the non-through-holes opened thereon, to provide through-silicon vias.

<Preparation Step for Silicon Substrate>

In this step, as shown in FIG. 6(a), a silicon substrate 41 having a silicon wafer 1 provided with non-through-holes 31; and a metal coating film 2 provided on the wall surface and bottom face of the non-through-holes 31 and the surface of the silicon wafer 1, can be prepared. The non-through-holes 31 are opened at one principal surface of the silicon wafer 1.

From the viewpoint of suppressing warpage of the substrate after sintering, the thickness of the silicon wafer 1 may be 20 μm or more, 30 μm or more, or 50 μm or more, and may be 500 μm or less, 400 μm or less, or 300 μm or less.

The upper limit value of the hole diameter of the non-through-holes 31 may be 200 μm or less, 100 μm or less, or 60 μm or less, from the viewpoint of promoting an increase in the density of the obtainable semiconductor device, and the lower limit value of the hole diameter of the non-through-holes 31 is not particularly limited by may be 10 μm or more or may be 30 μm or less.

The hole length (hole depth) of the non-through-holes 31 can be appropriately set according to the length of the through-silicon vias to be formed.

The metal coating film 2 may be provided on the surface at which the non-through-holes 31 are opened in the silicon wafer 1 and on the wall surface and bottom face of the non-through-holes 31, may be provided on the wall surface and bottom face of the non-through-holes 31, or may not be provided. According to the embodiment shown in FIG. 6(a), the silicon substrate 41 comprises the metal coating film 2 on the surface where the non-through-holes 31 are opened in the silicon wafer 1 and on the wall surface and bottom face of the non-through-holes 31.

Regarding the metal coating film 2, a material similar to that of the first embodiment can be used.

<Copper Sintered Body Formation Step>

In this step, a copper sintered body having a porous structure is formed such that the copper sintered body fills at least the non-through-holes. According to the present embodiment, the copper sintered body may be formed so as to cover at least a portion of the surface where the non-through-holes 31 are opened in the silicon substrate 41. In this case, an electric conductor that fills the non-through-holes 31 of the silicon substrate 41 can be formed, and at the same time, an electric conductor can also be provided on the surface where the non-through-holes 31 are opened in the silicon substrate.

The copper sintered body formation step may have a copper paste filling step of filling the non-through-holes of the silicon substrate with a copper paste including copper particles; and a copper paste calcination step of calcining the copper paste to form the above-described copper sintered body. When the copper sintered body is formed at the surface where the non-through-holes are opened in the silicon substrate, a layer of the copper paste can also be provided on the surface where the non-through-holes are opened in the silicon substrate during the copper paste filling step or thereafter.

In the above-described copper sintered body formation step, for example, as shown in FIG. 6(b), a copper paste 3 including copper particles is applied on the silicon substrate 41, the non-through-holes 31 are filled with the copper paste 3, and at the same time, a layer of the copper paste 3 can also be provided on the surface where the non-through-holes 31 are opened in the silicon substrate 41. The details of the copper paste 3 will be described below.

Regarding a method of applying the copper paste 3 on the silicon substrate 41, a method similar to that of the first embodiment may be mentioned.

When the copper paste is also applied on the surface where the non-through-holes 31 are opened in the silicon substrate 41, the thickness of the copper paste layer may be 30 μm or less, 20 μm or less, 15 μm or less, or 10 μm or less, from the viewpoint of suppressing warpage of the silicon substrate 41 and reducing the burden in the electric conductor removal step that will be described below.

The copper paste 3 may be appropriately dried in the same manner as in the first embodiment. When the copper paste 3 is dried, the atmosphere during drying, the drying method, and the drying temperature may be similar to those of the first embodiment.

After the copper paste filling step, the copper particles included in the copper paste 3 are sintered by calcining the copper paste 3. In this manner, as shown in FIG. 7(c), a copper sintered body-filled silicon substrate 60 in which the non-through-holes 31 are filled with a copper sintered body 5 including pores 4, that is, having a porous structure, is obtained. According to the present embodiment, a copper sintered body-filled silicon substrate 60 in which the copper sintered body 5 is also provided on the surface where the non-through-holes 31 are opened in the silicon substrate 41, is obtained.

The conditions for calcination may be similar to those of the first embodiment.

The porosity of the copper sintered body formed on the surface where the non-through-holes are opened in the silicon substrate may be similar to the porosity of the copper sintered body formed on the principal surface of the silicon substrate according to the first embodiment. The porosity of the copper sintered body can be calculated by a procedure similar to that of the first embodiment.

The porosity of the copper sintered body filled in the non-through-holes may be similar to the porosity of the copper sintered body filled in the through-holes according to the first embodiment.

The proportion of copper element in the elements excluding light elements among the constituting elements in the copper sintered body may be similar to that of the first embodiment.

<Resin Impregnation Step>

In this step, for example, the copper sintered body 5 can be impregnated with a curable resin composition by applying the curable resin composition on the copper sintered body-filled silicon substrate 60 obtainable by the copper sintered body formation step. In the present embodiment, the copper sintered body 5 filled in the non-through-holes 31 and the copper sintered body 5 formed on the surface where the non-through-holes are opened in the silicon substrate 41 are impregnated with the curable resin composition. Incidentally, it is preferable that the pores 4 of the copper sintered body 5 are sufficiently filled with the impregnated curable resin composition.

Regarding the curable resin composition, one similar to that of the first embodiment can be used. Regarding the method of applying the curable resin composition, a method similar to the first embodiment may be mentioned. The filling ratio of the cured resin composition in the pores 4 of the copper sintered body 5 can be appropriately changed in accordance with the filling ratio of the resin cured product 6 of the electric conductor 35 after the resin curing step.

<Resin Curing Step>

In this step, an electric conductor 35 including the copper sintered body 5 having the pores 4 filled with the resin cured product 6 is formed by curing the curable resin composition impregnated into the copper sintered body 5 (curable resin composition filled in the pores 4). In the case of the present embodiment, an electric conductor 35 including the copper sintered body 5 having the pores 4 filled with the resin cured product 6 is provided even on the surface where the non-through-holes are opened in the silicon substrate 41.

The curing conditions for the resin composition in the resin curing step may be similar to those of the first embodiment.

With regard to the electric conductor formed in the resin curing step (electric conductor before the electric conductor removal step and the grinding step), the filling ratio of the resin cured product may be adjusted such that the filling ratio of the resin cured product in the through-silicon vias to be formed satisfies the conditions that will be described below. For example, the electric conductor may be such that the filling ratio of the resin cured product satisfies the following conditions.

(Electric Conductor of Non-Through-Hole)

(a) In a region extending from a spot where a line extending in the thickness direction of the substrate through the center part of a non-through-hole (center in the hole length and center in the hole diameter at the length center) intersects the surface of the electric conductor to a depth of 10 μm, the filling ratio of the resin cured product may be 80% by volume or more, 90% by volume or more, or 95% by volume or more, based on the sum of the volumes of the internal spaces of the pores in the copper sintered body.

(b) In a region extending from the spot where a line extending in the thickness direction of the substrate through the center part of a non-through-hole intersects the surface of the electric conductor to a depth of 10 to 20 μm, the filling ratio of the resin cured product may be 80% by volume or more, 90% by volume or more, or 95% by volume or more, based on the sum of the volumes of the internal spaces of the pores in the copper sintered body.

(c) In a region extending from the spot where a line extending in the thickness direction of the substrate through the center part of a non-through-hole intersects the surface of the electric conductor to a depth of 20 to 30 μm, the filling ratio of the resin cured product may be 80% by volume or more, 90% by volume or more, or 95% by volume or more, based on the sum of the volumes of the internal spaces of the pores in the copper sintered body.

(Electric Conductor on Principal Surface of Substrate)

(e) In a region extending from the surface of the electric conductor formed on a principal surface of the substrate to a depth of 5 μm, the filling ratio of the resin cured product may be 80% by volume or more, 90% by volume or more, or 95% by volume or more, based on the sum of the volumes of the internal spaces of the pores in the copper sintered body.

(f) In a region extending from the surface of the electric conductor formed on a principal surface of the substrate to a depth of 10 μm, the filling ratio of the resin cured product may be 80% by volume or more, 90% by volume or more, or 95% by volume or more, based on the sum of the volumes of the internal spaces of the pores in the copper sintered body.

(g) In a region extending from the surface of the electric conductor formed on a principal surface of the substrate to a depth of 10 to 20 μm, the filling ratio of the resin cured product may be 80% by volume or more, 90% by volume or more, or 95% by volume or more, based on the sum of the volumes of the internal spaces of the pores in the copper sintered body.

(h) In a region extending from the surface of the electric conductor formed on a principal surface of the substrate to a depth of 20 to 30 μm, the filling ratio of the resin cured product may be 80% by volume or more, 90% by volume or more, or 95% by volume or more, based on the sum of the volumes of the internal spaces of the pores in the copper sintered body.

The filling ratio of the resin cured product 6 in the electric conductor is calculated in the same manner as the procedure described in connection to the method for producing a substrate having through-silicon vias according to the first embodiment.

<Electric Conductor Removal Step>

The method for producing a substrate having through-silicon vias of the present embodiment may further have an electric conductor removal step after the resin curing step. In this step, at least a portion of the electric conductor 35 formed on one principal surface of the silicon substrate 41 can be removed. The means for removing the electric conductor may be similar to that of the first embodiment.

<Grinding Step>

In this step, as shown in FIG. 7(*d*), a substrate 61 having through-silicon vias, which is provided with silicon electrodes, can be obtained by grinding a surface of the silicon substrate where the electric conductor 35 is formed, the surface being on the opposite side of the surface where the non-through-holes 31 are opened. That is, in this step, the electric conductor 35 is exposed, by grinding, also at the surface of the silicon substrate on the opposite side from the surface where the non-through-holes 31 are opened to form through-silicon vias. In FIG. 7(*d*), the electric conductor 35 formed on the surface of the silicon substrate where the non-through-holes 31 are opened is removed by the electric conductor removal step.

Examples of the grinding method include mechanical polishing and chemical mechanical polishing; however, the grinding method is not limited to this.

According to the present embodiment, the filling ratio of the resin cured product 6 in the electric conductor 35 after the grinding step may satisfy the following conditions. The filling ratio can be calculated as described above.

(a) In a region extending from a spot S21, where a line L2 extending in the thickness direction of the substrate through the center part E of a through-silicon via (center in the length L and center in the hole diameter D at the length center) intersects the surface of the electric conductor 35, to a depth of 10 μm, the filling ratio of the resin cured product may be 80% by volume or more, 90% by volume or more, or 95% by volume or more, based on the sum of the volumes of the internal spaces of the pores in the copper sintered body.

(b) In a region extending from the spot S21 to a depth of 10 to 20 μm, the filling ratio of the resin cured product may be 80% by volume or more, 90% by volume or more, or 95% by volume or more, based on the sum of the volumes of the internal spaces of the pores in the copper sintered body.

(c) In a region extending from the spot S21 to a depth of 20 to 30 μm, the filling ratio of the resin cured product may be 80% by volume or more, 90% by volume or more, or 95% by volume or more, based on the sum of the volumes of the internal spaces of the pores in the copper sintered body.

(d) In an area measuring ±5 µm in the thickness direction of the substrate and ±5 µm in a direction orthogonally intersecting the thickness direction of the substrate, both from the center part E of a through-silicon via, the filling ratio of the resin cured product may be 80% by volume or more, 90% by volume or more, or 95% by volume or more, based on the sum of the volumes of the internal spaces of the pores in the copper sintered body.

The ratio L/D of the length L to the hole diameter D of a through-silicon via may be similar to that of the first embodiment.

(Substrate Having Through-Silicon Vias According to Second Embodiment)

FIG. 7(d) is a cross-sectional view illustrating an embodiment of a substrate having through-silicon vias, which can be produced by the above-mentioned method according to the second embodiment. The substrate 61 having through-silicon vias as shown in FIG. 7(d) comprises a silicon substrate including a silicon wafer 1 provided with through-holes, the silicon substrate having the through-holes communicating with both principal surfaces; and an electric conductor 35 filled in the through-holes, and the electric conductor 35 includes a copper sintered body 5 having a porous structure and a resin cured product 6 filled in the pores 4 of the copper sintered body 5.

In the substrate 61 having through-silicon vias as shown in FIG. 7(d), the electric conductor 35 is not formed on both principal surfaces; however, the electric conductor 35 may be formed on one principal surface. In the substrate 61 having through-silicon vias as shown in FIG. 7(d), a metal coating film 2 is provided on the wall surfaces of the through-holes; however, the metal coating film 2 may not be provided on the wall surfaces of the through-holes.

The filling ratio of the resin cured product 6 in the electric conductor 35 included in the substrate 61 having through-silicon vias may be similar to the filling ratio of the resin cured product 6 in the electric conductor 35 after the grinding step.

(Semiconductor Device According to Second Embodiment)

Figure 8:
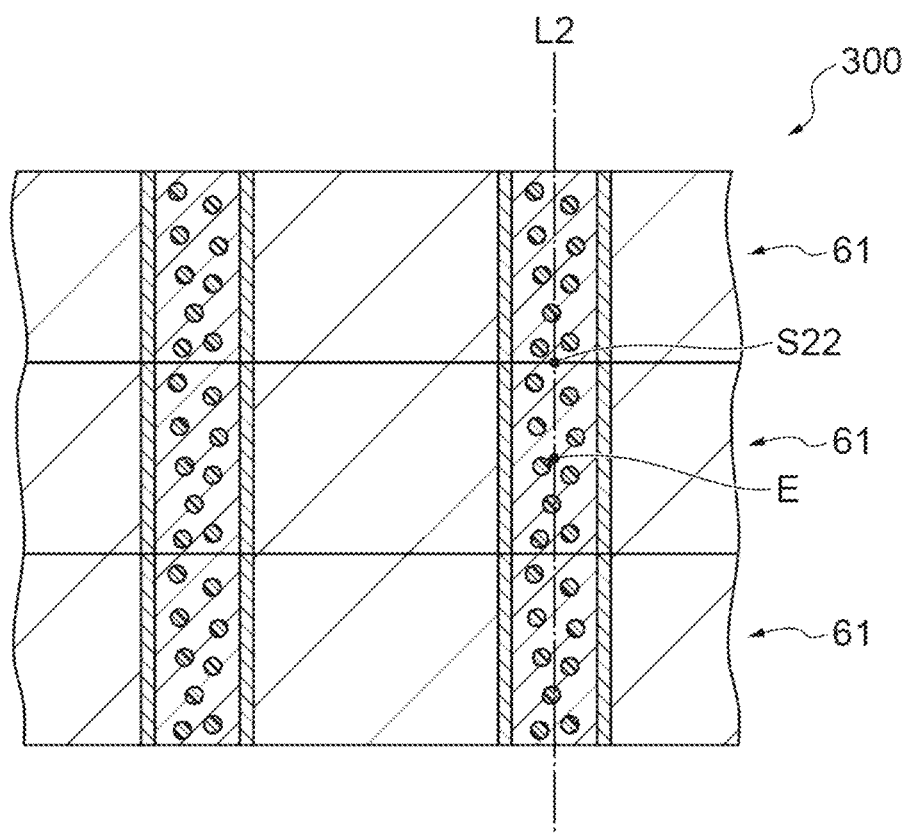
FIG. 8 is a schematic diagram illustrating a semiconductor device according to the second embodiment.

A semiconductor device produced using the substrate having through-silicon vias according to the second embodiment will be specifically described using FIG. 8. FIG. 8 is a schematic cross-sectional view illustrating an embodiment of the semiconductor device of the present invention. In the semiconductor device 300 shown in FIG. 8, substrates 61 having through-silicon vias are repeatedly laminated. The substrates 61 having through-silicon vias are electrically connected.

The semiconductor device 300 may be such that the filling ratio of the resin cured product 6 in the electric conductor 35 satisfies the following conditions. Incidentally, the filling ratio can be calculated in the same manner as described above.

(Electric Conductor of Through-Silicon Via)

(a) In a region extending from a spot S22, where a line L2 extending in the thickness direction of the substrate through the center part E of a through-silicon via (center in the length L and center in the hole diameter D at the length center) intersects the surface of the electric conductor 35, to a depth of 10 µm, the filling ratio of the resin cured product may be 80% by volume or more, 90% by volume or more, or 95% by volume or more, based on the sum of the volumes of the internal spaces of the pores in the copper sintered body.

(b) In a region extending from the spot S22 to a depth of 10 to 20 µm, the filling ratio of the resin cured product may be 80% by volume or more, 90% by volume or more, or 95% by volume or more, based on the sum of the volumes of the internal spaces of the pores in the copper sintered body.

(c) In a region extending from the spot S22 to a depth of 20 to 30 µm, the filling ratio of the resin cured product may be 80% by volume or more, 90% by volume or more, or 95% by volume or more, based on the sum of the volumes of the internal spaces of the pores in the copper sintered body.

(d) In an area measuring ±5 µm in the thickness direction of the substrate and ±5 µm in a direction orthogonally intersecting the thickness direction of the substrate, both from the center part E of a through-silicon via, the filling ratio of the resin cured product may be 80% by volume or more, 90% by volume or more, or 95% by volume or more, based on the sum of the volumes of the internal spaces of the pores in the copper sintered body.

(Copper Paste)

The copper paste including copper particles, which is used for the methods for producing a substrate having through-silicon vias according to the first embodiment and the second embodiment, will be described.

The copper paste may include, as the copper particles, for example, first copper particles having a particle size (maximum diameter) of 0.8 µm or more.

The particle size (maximum diameter) of the first copper particles may be 1.2 µm or more. The particle size (maximum diameter) of the first copper particles may be 10 µm or less or may be 8.0 µm or less.

The average particle size (average maximum diameter) of the first copper particles included in the copper paste may be 0.5 µm or more, 0.8 µm or more, or 1.2 µm or more and may be 20 µm or less, 10 µm or less, or 8 µm or less, from the viewpoint of enhancing the sintered density in the through-holes and suppressing the voids generated in the through-holes.

The particle size (maximum diameter) and the average particle size (average maximum diameter) of the first copper particles can be determined from, for example, a SEM image of the particles. An example of a method of calculating the particle size (maximum diameter) of the first copper particles from a SEM image will be described. A powder of the first copper particles is placed on a carbon tape for SEM with a spatula so as to be used as a sample for SEM. This sample for SEM is observed at a magnification ratio of 5000 times using a SEM apparatus. A rectangle circumscribing a first copper particle in a SEM image is drawn by image processing software, and the long side of the rectangle is designated as the particle size (maximum diameter) of the particle. This measurement is performed for 50 or more of the first particles using a plurality of SEM images, and the average value (average maximum diameter) of the particle size is calculated.

The shape of the first copper particles may be, for example, a spherical shape, a lump shape, a needle shape, a flat shape (flaky shape), or a substantially spherical shape. The first copper particles may also be aggregates of copper particles having these shapes.

The first copper particles preferably have a flat shape (flaky shape) having an aspect ratio (major axis/thickness) of 4 or more. In this case, as the first copper particles are oriented approximately in parallel with the surface coated with the copper paste, volumetric shrinkage occurring at the time of sintering the copper particles in the copper paste is suppressed, and it becomes easy to suppress the voids generated in the through-holes. Furthermore, as the volumetric shrinkage occurring at the time of sintering the copper particles in the copper paste is suppressed, cracking in the copper sintered body formed on at least one principal surface of the silicon substrate can be suppressed.

The aspect ratio of the first copper particles is preferably 4 or more, more preferably 5 or more, and even more preferably 6 or more. When the aspect ratio is in the above-described range, the first copper particles in the copper paste are likely to be oriented in parallel with the surface coated with the copper paste, and the volumetric shrinkage occurring at the time of sintering the copper particles in the copper paste can be suppressed. As a result, when wiring is formed from the electric conductor provided on the principal surfaces of the silicon substrate, disconnection caused by thermal stress of the wiring can be further suppressed. Furthermore, the close adhesiveness between the copper sintered body and the metal coating film formed on the silicon wafer can be enhanced. The aspect ratio (major axis/thickness) of the copper particles in the copper paste can be determined by, for example, observing a SEM image of the particles and measuring the major axis and the thickness.

It is preferable that the copper paste includes first copper particles having a particle size (maximum diameter) of from 0.8 μm to 10 μm and an aspect ratio of 4 or more. When the copper paste includes such first copper particles, the volumetric shrinkage occurring at the time of sintering the copper particles in the copper paste can be sufficiently reduced, and it becomes easy to form a copper sintered body having a porous structure, in which an electrically conductive network is sufficiently formed, in the through-holes or non-through-holes. As a result, the generation of voids in the through-holes or non-through-holes can be suppressed, a copper sintered body in which cracks are not likely to be generated on the principal surfaces of the silicon substrate can be formed, and when wiring is formed from an electric conductor including this copper sintered body, disconnection caused by thermal stress of the wiring can be further suppressed.

The copper paste may include copper particles having a particle size (maximum diameter) of from 0.8 μm to 10 μm and an aspect ratio of less than 2; however, the content of copper particles having a particle size (maximum diameter) of from 0.8 μm to 10 μm and an aspect ratio of less than 2 may be 50 parts by mass or less, 30 parts by mass or less, 20 parts by mass or less, 10 parts by mass or less, or 0 parts by mass, with respect to 100 parts by mass of the first copper particles having a particle size (maximum diameter) of from 0.8 μm to 10 μm and an aspect ratio of 4 or more. By limiting the content of copper particles having a particle size (maximum diameter) of from 0.8 μm to 10 μm and an aspect ratio of less than 2, a copper sintered body having a porous structure, in which an electrically conductive network is sufficiently formed, can be formed in the through-holes or the non-through-holes, while suppressing the generation of voids in the through-holes due to the first copper particles in the copper paste. Furthermore, on the principal surfaces of the silicon substrate, the first copper particles are likely to be oriented approximately in parallel with the surface coated with the copper paste, a copper sintered body in which cracks are not likely to be generated can be formed by more effectively suppressing volumetric shrinkage, and when wiring is formed from an electric conductor including this copper sintered body, disconnection caused by thermal stress of the wiring can be further suppressed.

The content of the first copper particles in the copper paste may be 15% by mass or more, 20% by mass or more, or 50% by mass or more, and may be 85% by mass or less, 70% by mass or less, or 50% by mass or less, based on the total mass of the metal particles included in the copper paste. When the content of the first copper particles is in the above-described range, the above-mentioned effects are more easily obtained.

From the viewpoints of dispersion stability and oxidation resistance, the first copper particles may be treated with a surface treatment agent. The surface treatment agent may be removed at the time of wiring formation (during sintering of the copper particles). Examples of such a surface treatment agent include aliphatic carboxylic acids such as palmitic acid, stearic acid, arachidic acid, and oleic acid; aromatic carboxylic acids such as terephthalic acid, pyromellitic acid, and o-phenoxybenzoic acid; aliphatic alcohols such as cetyl alcohol, stearyl alcohol, isobornyl cyclohexanol, and tetraethylene glycol; aromatic alcohols such as p-phenylphenol; alkylamines such as octylamine, dodecylamine, and stearylamine; aliphatic nitriles such as stearonitrile and decanenitrile; silane coupling agents such as an alkylalkoxysilane; and polymer treatment agents such as polyethylene glycol, polyvinyl alcohol, polyvinylpyrrolidone, and a silicone oligomer. The surface treatment agents may be used singly, or two or more kinds thereof may be used in combination.

The throughput of the surface treatment agent may be an amount equivalent to one molecular layer or more on the particle surface. The throughput of such a surface treatment agent varies depending on the specific surface area of the first copper particles, the molecular weight of the surface treatment agent, and the minimum coating area of the surface treatment agent. The throughput of the surface treatment agent is usually 0.001% by mass or more.

The throughput of the surface treatment agent can be calculated from the number of molecular layers (n) adhering to the surface of the first copper particles, the specific surface area ($A_p$) (unit m$^2$/g) of the first copper particles, the molecular weight ($M_s$) (unit g/mol) of the surface treatment agent, the minimum coating area ($S_S$) (unit m$^2$/unit) of the surface treatment agent, and the Avogadro constant ($N_A$) ($6.02 \times 10^{23}$ units). Specifically, the throughput of the surface treatment agent is calculated by the formula: throughput (% by mass) of surface treatment agent=$\{(n \cdot A_p \cdot M_s)/(S_S \cdot N_A + n \cdot A_p \cdot M_s)\} \times 100\%$.

The specific surface area of the first copper particles can be calculated by measuring dried copper particles by a BET specific surface area measurement method. The minimum coating area of the surface treatment agent is $2.05 \times 10^{-19}$ m$^2$/molecule, when the surface treatment agent is a linear saturated fatty acid. In the case of other surface treatment agents, for example, the minimum coating area can be measured by computation from a molecular model or by the method described in "Kagaku to Kyoiku (Chemistry and Education)" (UEDA Katsuhiro, INAFUKU Sumio, MORI Iwao, 40(2), 1992, p. 114-117). An example of the method for quantitatively determining the surface treatment agent will be described. The surface treatment agent can be identified by a thermal desorption gas/gas chromatography mass spectrometer of a dry powder obtained by removing the dispersing medium from the copper paste, and the number of carbon atoms and the molecular weight of the surface treatment agent can be determined thereby. The carbon content proportion of the surface treatment agent can be analyzed by a carbon content analysis. Examples of the carbon content analysis method include a high-frequency induction heating furnace combustion/infrared absorption method. The amount of the surface treatment agent can be calculated by the above-described formula from the number of carbon atoms, the molecular weight, and the carbon content proportion of the identified surface treatment agent.

Regarding the first copper particles, commercially available products can be used. Examples of commercially available first copper particles include MA-C025 (manufactured by Mitsui Mining & Smelting Co., Ltd., average particle size 4.1 μm), 3L3 (manufactured by Fukuda Metal Foil & Powder Co., Ltd., average particle size 7.3 μm), 1110F (manufactured by Mitsui Mining & Smelting Co., Ltd., average particle size 5.8 μm), and 2L3 (manufactured by Fukuda Metal Foil & Powder Co., Ltd., average particle size 9 μm).

During the production of the copper paste, copper particles which include the first copper particles having a particle size (maximum diameter) of from 0.8 μm to 10 μm and an aspect ratio of 4 or more, and in which the content of copper particles having a particle size (maximum diameter) of from 0.8 μm to 10 μm and an aspect ratio of less than 2 is in the above-mentioned range, can be used. It is also acceptable to select and use a commercially available product comprising such copper particles.

The ratio (maximum diameter) (hole diameter (μm)/particle size (μm)) between the hole diameter of the through-holes and the particle size (maximum diameter) of the first copper particles may be 4 or more, 8 or more, or 10 or more, and may be 150 or less, 100 or less, or 50 or less, from the viewpoint that volumetric shrinkage can be suppressed, and a copper sintered body in which cracks are not likely to be generated can be formed. With regard to the non-through-holes, the ratio (maximum diameter) (hole diameter (μm)/particle size (μm)) between the hole diameter of the non-through-holes and the particle size (maximum diameter) of the first copper particles can be set such that the ratio (maximum diameter) (hole diameter (μm)/particle size (μm)) between the hole diameter of the through-silicon vias to be formed and the particle size (maximum diameter) of the first copper particles is in the above-described range.

According to an embodiment, the copper paste may include the above-mentioned first copper particles and second copper particles having a particle size (maximum diameter) of 0.5 μm or less. In this case, when the copper particles are sintered, the conduction properties of the obtainable wiring tend to be enhanced as the second copper particles are interposed between the first copper particles. That is, it is preferable to use the first copper particles and the second copper particles in combination. When the copper paste is prepared only from the second copper particles, since the volumetric shrinkage and sintering shrinkage brought by drying of the dispersing medium are large, the sintered product is easily detached from the metal coating film provided on the silicon wafer at the time of sintering the copper particles, and sufficient airtightness and connection reliability are not likely to be obtained; however, when the first copper particles and the second copper particles are used in combination, the volumetric shrinkage at the time of sintering the copper paste is suppressed, and the adhesiveness between the copper sintered body formed in the through-holes and the metal coating film formed on the wall surfaces of the through-holes or the non-through-holes can be enhanced. As a result, fracture caused by thermal stress of the copper sintered body in the through-holes is further unlikely to occur, and the airtightness and the connection reliability caused by thermal stress are further enhanced.

The second copper particles can act as copper particles that suitably join between the first copper particles. Furthermore, the second copper particles have superior sinterability compared to the first copper particles and can have a function of promoting sintering of the copper particles. For example, it is possible to sinter the copper particles at a lower temperature as compared to the case of using the first copper particles alone. Furthermore, when the copper paste is prepared only from the second copper particles, since the volumetric shrinkage and sintering shrinkage brought by drying of the dispersing medium are large, voids are likely to occur inside the through-holes or non-through-holes as the copper sintered body formed inside the through-holes or the non-through-holes undergoes volumetric shrinkage. Particularly, when flat-shaped first copper particles and second copper particles are used in combination, the flat-shaped first copper particles act as copper particles that are suitably joined by the second copper particles, and as a result, it is easy to form a copper sintered body having a porous structure while suppressing the generation of voids inside the through-holes.

The average particle size (average maximum diameter) of the second copper particles included in the copper paste may be 0.01 μm or more, 0.03 μm or more, 0.05 μm or more, 0.08 μm or more, 0.1 μm or more, or 0.2 μm or more, and may be 0.5 μm or less, 0.4 μm or less, 0.3 μm or less, or 0.2 μm or less.

When the average particle size (average maximum diameter) of the second copper particles is 0.01 μm or more, effects such as suppression of the synthesis cost of the second copper particles, satisfactory dispersibility, and suppression of the use amount of the surface treatment agent are likely to be obtained. When the average particle size (average maximum diameter) of the second copper particles is 0.5 μm or less, an effect that sinterability of the second copper particles is excellent is likely to be obtained.

The second copper particles may include 20% by mass or more of copper particles having a particle size (maximum diameter) of from 0.01 μm to 0.5 μm. From the viewpoint of the sinterability of the copper paste, the second copper particles may include 30% by mass or more of copper particles having a particle size of from 0.01 μm to 0.5 μm, may include 50% by mass or more of the copper particles, and may include 85% by mass or more of the copper particles. When the content proportion of the copper particles having a particle size (maximum diameter) of from 0.01 μm to 0.5 μm in the second copper particles is 20% by mass or more, the dispersibility of the copper particles is further enhanced, an increase in the viscosity and a decrease in the paste concentration can be further suppressed.

The content of the second copper particles in the copper paste may be 20% by mass or more, 30% by mass or more, 35% by mass or more, or 40% by mass or more, and may be 85% by mass or less, 80% by mass or less, or 75% by mass or less, based on the total mass of the metal particles included in the copper paste. When the content of the second copper particles is in the above-described range, a copper sintered body having excellent adhesiveness to the metal coating film provided on the silicon substrate is likely to be formed while suppressing the generation of voids in the through-holes or the non-through-holes, a copper sintered body in which cracks are not likely to be generated can be formed on the principal surfaces of the silicon substrate, and when wiring is formed from an electric conductor including the copper sintered body, disconnection caused by thermal stress of the wiring can be further suppressed.

The content of the second copper particles in the copper paste may be 20% by mass or more and may be 85% by mass or less, based on the sum of the mass of the first copper particles and the mass of the second copper particles. When the content of the second copper particles is 20% by mass or more, the space between the first copper particles can be sufficiently filled, a copper sintered body in which cracks are not likely to be generated can be formed, and wiring formed from an electric conductor including this copper sintered body is further unlikely to undergo disconnection caused by thermal stress. When the content of the second copper particles is 85% by mass or less, since volumetric shrinkage at the time of sintering the copper particles can be sufficiently suppressed, the generation of voids in the through-holes or the non-through-holes can be suppressed, a copper sintered body in which cracks are not likely to be generated can be formed, and wiring formed from an electric conductor including this copper sintered body is further unlikely to undergo disconnection caused by thermal stress.

From the viewpoint that the above-described effect is more easily obtained, the content of the second copper particles may be 30% by mass or more, 35% by mass or more, or 40% by mass or more, and may be 85% by mass or less or 80% by mass or less, based on the sum of the mass of the first copper particles and the mass of the second copper particles.

Examples of the shape of the second copper particles include a spherical shape, a lump shape, a needle shape, a flat shape (flaky shape), and an approximately spherical shape. The second copper particles may also be aggregates of copper particles having these shapes. From the viewpoints of dispersibility and filling properties, the shape of the second copper particles may be a spherical shape, an approximately spherical shape, or a flat shape (flaky shape), and from the viewpoints of combustibility, miscibility with the first copper particles, and the like, the shape of the second copper particles may be a spherical shape or an approximately spherical shape.

The aspect ratio of the second copper particles may be 5 or less, 4 or less, or 3 or less, from the viewpoints of dispersibility, filling properties, and miscibility with the first copper particles.

The second copper particles may be treated with a specific surface treatment agent. Regarding the specific surface treatment agent, for example, an organic acid having 8 to 16 carbon atoms may be mentioned. Examples of the organic acid having 8 to 16 carbon atoms include saturated fatty acids such as caprylic acid, methylheptanoic acid, ethylhexanoic acid, propylpentanoic acid, pelargonic acid, methyloctanoic acid, ethylheptanoic acid, propylhexanoic acid, capric acid, methylnonanoic acid, ethyloctanoic acid, propylheptanoic acid, butylhexanoic acid, undecanoic acid, methyldecanoic acid, ethylnonanoic acid, propyloctanoic acid, butylheptanoic acid, lauric acid, methylundecanoic acid, ethyldecanoic acid, propylnonanoic acid, butyloctanoic acid, pentylheptanoic acid, tridecanoic acid, methyldodecanoic acid, ethylundecanoic acid, propyldecanoic acid, butylnonanoic acid, pentyloctanoic acid, myristic acid, methyltridecanoic acid, ethyldodecanoic acid, propylundecanoic acid, butyldecanoic acid, pentylnonanoic acid, hexyloctanoic acid, pentadecanoic acid, methyltetradecanoic acid, ethyltridecanoic acid, propyldodecanoic acid, butylundecanoic acid, pentyldecanoic acid, hexylnonanoic acid, palmitic acid, methylpentadecanoic acid, ethyltetradecanoic acid, propyltridecanoic acid, butyldodecanoic acid, pentylundecanoic acid, hexyldecanoic acid, heptylnonanoic acid, methylcyclohexanecarboxylic acid, ethylcyclohexanecarboxylic acid, propylcyclohexanecarboxylic acid, butylcyclohexanecarboxylic acid, pentylcyclohexanecarboxylic acid, hexylcyclohexanecarboxylic acid, heptylcyclohexanecarboxylic acid, octylcyclohexanecarboxylic acid, and nonylcyclohexanecarboxylic acid; unsaturated fatty acids such as octenoic acid, nonenoic acid, methylnonenoic acid, decenoic acid, undecenoic acid, dodecenoic acid, tridecenoic acid, tetradecenoic acid, myristoleic acid, pentadecenoic acid, hexadecenoic acid, palmitoleic acid, and sapienic acid; and aromatic carboxylic acids such as terephthalic acid, pyromellitic acid, o-phenoxybenzoic acid, methylbenzoic acid, ethylbenzoic acid, propylbenzoic acid, butylbenzoic acid, pentylbenzoic acid, hexylbenzoic acid, heptylbenzoic acid, octylbenzoic acid, and nonylbenzoic acid. The organic acids may be used singly, or two or more kinds thereof may be used in combination. By combining such an organic acid and the second copper particles, there is a tendency that both the dispersibility of the second copper particles and the eliminability of the organic acid at the time of sintering can be achieved.

The throughput of the surface treatment agent may be an amount of adhering one molecular layer to three molecular layers to the surface of the second copper particles. The throughput of the surface treatment agent may be 0.07% by mass or more, 0.10% by mass or more, or 0.2% by mass or more, and may be 2.1% by mass or less, 1.6% by mass or less, or 1.1% by mass or less. The surface treatment amount of the second copper particles can be calculated by the method described above in connection with the first copper particles. The same also applies to the specific surface area, the molecular weight of the surface treatment agent, and the minimum coating area of the surface treatment agent.

Regarding the second copper particles, synthesized copper particles or commercially available copper particles can be used.

The sum of the content of the first copper particles and the content of the second copper particles in the copper paste may be 90% by mass or more based on the total mass of the metal particles included in the copper paste. When the sum of the content of the first copper particles and the content of the second copper particles is in the above-described range, the generation of voids in the through-holes or the non-through-holes is likely to be suppressed. From the viewpoint that such an effect is more easily obtained, the sum of the content of the first copper particles and the content of the second copper particles may be 95% by mass or more or may be 100% by mass, based on the total mass of the metal particles.

The copper paste may further include other metal particles in addition to the copper particles. Examples of the other metal particles include particles of nickel, silver, gold, palladium, platinum, and the like. The average particle size (maximum diameter) of the other metal particles may be 0.01 µm or more or 0.05 µm or more, and may be 5 µm or less, 3.0 µm or less, or 2.0 µm or less. When the copper paste includes the other metal particles, the content thereof may be less than 20% by mass or may be 10% by mass or less, based on the total mass of the metal particles included in the copper paste, from the viewpoint of obtaining sufficient joining properties. The other metal particles may not be included. The shape of the other metal particles is not particularly limited.

The dispersing medium included in the copper paste is not particularly limited, and for example, the dispersing medium may be a volatile one. Examples of the volatile dispersing medium include monohydric and polyhydric alcohols such as pentanol, hexanol, heptanol, octanol, decanol, ethylene glycol, diethylene glycol, propylene glycol, butylene glycol, α-terpineol, and isobornylcyclohexanol (MTPH); ethers such as ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether; esters such as ethylene glycol ethyl ether acetate, ethylene glycol butyl ether acetate, diethylene glycol ethyl ether acetate, diethylene glycol butyl ether acetate, dipropylene glycol methyl ether acetate (DPMA), ethyl lactate, butyl lactate, γ-butyrolactone, and propylene carbonate; acid amides such as N-methyl-2-pyrrolidone, N,N-dimethylacetamide, and N,N-dimethylformamide; aliphatic hydrocarbons such as cyclohexane, octane, nonane, decane, and undecane; aromatic hydrocarbons such as benzene, toluene, and xylene; a mercaptan having an alkyl group having 1 to 18 carbon atoms; and a mercaptan having a cycloalkyl group having 5 to 7 carbon atoms. Examples of the mercaptan having an alkyl group having 1 to 18 carbon atoms include ethylmercaptan, n-propylmercaptan, i-propylmercaptan, n-butylmercaptan, i-butylmercaptan, t-butylmercaptan, pentylmercaptan, hexylmercaptan, and dodecylmercaptan. Examples of the mercaptan having a cycloalkyl group having 5 to 7 carbon atoms include cyclopentylmercaptan, cyclohexylmercaptan, and cycloheptylmercaptan.

The content of the dispersing medium may be 3 parts by mass or more, 4 parts by mass or more, or 5 parts by mass or more, and may be 20 parts by mass or less, 16 parts by mass or less, or 12 parts by mass or less, with respect to 100 parts by mass of the total mass of the metal particles included in the copper paste. When the content of the dispersing medium is in the above-described range, the copper paste can be adjusted to have a more appropriate viscosity, and the generation of voids in the through-holes is likely to be suppressed.

If necessary, a wetting enhancer such as a nonionic surfactant or a fluorine-based surfactant; an antifoaming agent such as silicone oil; an ion trapping agent such as an inorganic ion exchanger; and the like may be appropriately added to the copper paste.

The above-mentioned copper paste can be prepared by mixing copper particles and optional components (additives, other metal particles, and the like) with a dispersing medium. After mixing of the various components, a stirring treatment may be carried out. The maximum diameter of the dispersion liquid may be adjusted by a classification operation.

The copper paste may be prepared by mixing second copper particles, a surface treatment agent, and a dispersing medium in advance, performing a dispersing treatment to prepare a dispersion liquid of the second copper particles, and further mixing first copper particles, other metal particles, and optional additives. By adopting such a procedure, the dispersibility of the second copper particles is enhanced to improve the miscibility of the first copper particles, and the performance of the copper paste is further enhanced. Aggregates may be removed by subjecting the dispersion liquid of the second copper particles to a classification operation.

EXAMPLES

Hereinafter, the present invention will be more specifically described by way of Examples. However, the present invention is not intended to be limited to the following Examples.

(Synthesis of Second Copper Particles)
[Synthesis of Copper Nonanoate]

150 mL of 1-propanol (Kanto Chemical Co., Inc., special grade) was added with stirring to 91.5 g (0.94 mol) of copper hydroxide (Kanto Chemical Co., Inc., special grade), and 370.9 g (2.34 mol) of nonanoic acid (Kanto Chemical Co., Inc., 90% or more) was added thereto. The obtained mixture was heated and stirred for 30 minutes at 90° C. in a separable flask. The obtained solution was filtered in a heated state to remove undissolved materials. Thereafter, the solution was left to cool, and copper nonanoate thus produced was subjected to suction filtration and was washed with hexane until the washing liquid became transparent. An obtained powder was dried in an explosion proof oven at 50° C. for 3 hours to obtain copper(II) nonanoate. The yield point was 340 g (yield 96% by mass).

[Synthesis of Second Copper Particles]

15.01 g (0.040 mol) of the copper(II) nonanoate obtained as described above and 7.21 g (0.040 mol) of anhydrous copper(II) acetate (Kanto Chemical Co., Inc., special grade) were introduced into a separable flask, 22 mL of 1-propanol and 32.1 g (0.32 mol) of hexylamine (Tokyo Chemical Industry Co., Ltd., purity 99%) were added thereto, and the mixture was heated and stirred at 80° C. in an oil bath to dissolve. The solution was transferred into an ice bath and cooled until the internal temperature reached 5° C., and then 7.72 mL (0.16 mol) of hydrazine monohydrate (Kanto Chemical Co., Inc., special grade) was stirred in an ice bath. The molar ratio of copper:hexylamine was 1:4. Next, the mixture was heated and stirred at 90° C. in an oil bath. At that time, a reduction reaction accompanied by foaming proceeded, and the reaction was completed within 30 minutes. The inner wall of the separable flask showed copper luster, and the solution changed to dark red in color. Centrifugation was performed for 1 minute at 9000 rpm (rotations/minute) to obtain a solid. A process of further washing the solid with 15 mL of hexane was repeated three times, and acid residue was removed to obtain a powder of copper particles (second copper particles) having copper luster was obtained.

The copper particles synthesized as described above were observed with a transmission electron microscope (manufactured by JEOL, Ltd., product name: JEM-2100F). The average value of the major axes of randomly selected 200 copper particles was 104 nm. The shape of the second particles was a spherical shape.

(Preparation of Copper Paste)

Examples 1 to 73

The following raw materials were mixed at the proportions indicated in Tables 1 to 8 to prepare copper pastes.
[First Copper Particles]
  Flat 1.4 µm: 1100YP (manufactured by Mitsui Mining & Smelting Co., Ltd., average particle size 1.4 µm (D50), trade name)
  Flat 3.1 µm: 1200YP (manufactured by Mitsui Mining & Smelting Co., Ltd., average particle size 3.1 µm (D50), trade name)
  Flat 5.8 µm: MA-C05KP (manufactured by Mitsui Mining & Smelting Co., Ltd., average particle size 5.8 µm (D50), trade name)
  Flat 7.3 µm: MA-C05KFD (manufactured by Mitsui Mining & Smelting Co., Ltd., average particle size 7.3 µm (D50), trade name)

[Second Copper Particles]
  Spherical 100 nm: Copper particles synthesized as described above
  Spherical 250 nm: CH0200 (manufactured by Mitsui Mining & Smelting Co., Ltd., D50 250 nm, trade name)
[Others]
  Diethylene glycol (manufactured by Fujifilm Wako Pure Chemical Corporation)

Comparative Example 1

70 parts by mass of 1100YP (manufactured by Mitsui Mining & Smelting Co., Ltd., average particle size 1.4 µm (D50), trade name) as the first copper particles, 30 parts by mass of the copper particles synthesized as described above as the second copper particles, 5 parts by mass of diethylene glycol (manufactured by Fujifilm Wako Pure Chemical Corporation), and 5 parts by mass of a resin component were mixed, and a copper paste was prepared. Regarding the resin component, a mixture of an acrylic resin as an organic binder and a mixture of carbitol and terpineol (mass ratio of carbitol and terpineol in the mixture was carbitol:terpineol=1:1) as an organic solvent at a mass ratio of 1:2 was used.
(Preparation Step for Silicon Substrate)

Examples 1 to 73 and Comparative Example 1

A silicon substrate having through-holes and having a titanium layer, a nickel layer, and a copper layer formed in this order on both principal surfaces and the wall surfaces of the through-holes was prepared. The diameter of the silicon substrate was 6 inches, and the thickness was 500 µm. The hole diameters of the through-holes in the silicon substrates are shown in Tables 1 to 8. The titanium layer, the nickel layer, and the copper layer were formed sequentially by sputtering.
(Copper Sintered Body Formation Step)

<Examples 1 to 8, 12 to 21, 24 to 43, and 48 to 73, and Comparative Example 1

Each of the prepared copper pastes was applied on both principal surfaces of a silicon substrate using a metal spatula, and the through-holes were filled with the copper paste. After application, the copper paste was dried in air at 90° C. for 10 minutes. After drying, a copper paste layer having a thickness of 30 µm was formed on the silicon substrate.

The silicon substrate having the copper paste layer formed thereon was pressurized from both surfaces using pressurizing jigs. The pressure at the time of pressurization was set such that the pressure applied to the silicon substrate was the pressure described in Tables 1 to 8. The pressurizing jigs comprises flat aluminum plates and springs so that the pressure at the time of pressurization can be adjusted. The silicon substrate pressurized by the pressurizing jigs was disposed in a tubular furnace (manufactured by AVC Co., Ltd.), and the air in the tubular furnace was replaced with argon gas by causing argon gas to flow at a rate of 1 L/min. Subsequently, the copper paste was sintered by raising the temperature for 10 minutes while causing hydrogen gas to flow at a rate of 300 mL/min and performing a sintering treatment under the conditions of 300° C. for 60 minutes. Subsequently, the flow rate of argon gas was changed to 0.3 L/min, the copper paste was cooled, and the copper paste was taken out into air at or below 50° C., and a copper sintered body-filled silicon substrate was obtained. The thickness of the copper sintered body formed on both principal surfaces of the silicon substrate after sintering was 25 µm.

Examples 9 to 11

A copper sintered body-filled silicon substrate was obtained in the same manner as in Example 1, except that the silicon substrate was not pressurized by pressurizing jigs. The thickness of the copper sintered body formed on both principal surfaces of the silicon substrate after sintering was 35 µm.

Examples 22 and 23

A copper sintered body-filled silicon substrate was obtained in the same manner as in Example 1, except that nitrogen gas was caused to flow instead of hydrogen gas at the time of sintering treatment. The thickness of the copper sintered body formed on both principal surfaces of the silicon substrate after sintering was 30 µm.

Examples 44 to 47

A copper sintered body-filled silicon substrate was obtained in the same manner as in Example 1, except that the sintering treatment was performed by setting the time for temperature rise to 10 minutes and performing the sintering treatment under the conditions of 225° C. and 60 minutes. The thickness of the copper sintered body formed on both principal surfaces of the silicon substrate after sintering was 30 µm.
(Measurement of Porosity of Copper Sintered Body)

Examples 1 to 73 and Comparative Example 1

A cross-section of the center part of a through-hole of the silicon substrate and a cross-section of the copper sintered body provided on the principal surfaces of the silicon substrate were exposed by means of a focused ion beam using a focused ion beam processing observation apparatus (manufactured by Hitachi High-Technologies Corporation, trade name: MI4050), and the cross-sections were observed. When the cross-section of the center part of a through-hole was observed, an area measuring ±5 µm in the thickness direction of the silicon substrate and ±5 µm in a direction orthogonally intersecting the thickness direction of the silicon substrate, both from the center part of the copper sintered body filled in the through-hole, was observed. When the cross-section of the copper sintered body provided on the principal surfaces of the silicon substrate was observed, an area measuring 10 µm in the thickness direction of the silicon substrate and 10 µm in the direction orthogonally intersecting the thickness of the silicon substrate, in a region extending from the surface of the copper sintered body formed on a principal surface of the silicon substrate to a depth of 5 µm, was observed.

Figure 9:
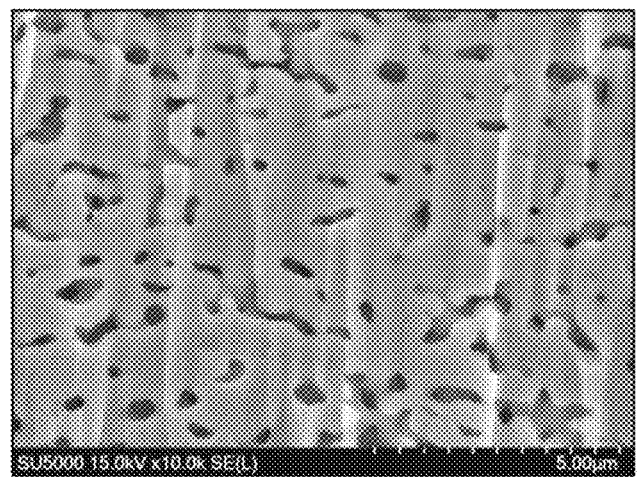
FIG. 9 is photographs of a cross-section of a copper sintered body formed in through-holes of a substrate having through-silicon vias obtained in Example 1.
Figure 9:

For the observation, a cross-sectional image (about 10 µm on each side) of the copper sintered body was captured using a scanning electron microscope (manufactured by Hitachi High-Technologies Corporation, trade name: S-3700N) by setting the magnification ratio at 10000 times. Five sites were selected as the observation sites. The obtained cross-sectional image was subjected to a binarization treatment using image analysis software (Adobe Photoshop (registered trademark) Elements) such that a sintered copper portion and a porous portion were divided. The binarization-treated cross-sectional image is shown in FIG. 9. At each of the five observation sites, the ratio of the area of the porous portion with respect to the total area of the cross-section of the copper sintered body was defined as porosity. The average value of the porosities observed at the five sites was defined as porosity of the copper sintered body. The results are shown in Tables 1 to 8.
(Resin Impregnation Step)

Examples 1 to 73

A curable resin composition shown below was applied on one surface of the copper sintered body-filled silicon substrate using a roll coater. Next, the copper sintered body-filled silicon substrate was disposed in a container, and the container was brought to a vacuum state by suctioning such that the gauge pressure inside the container would be 100 KPa. The copper sintered body-filled silicon substrate was maintained in a vacuum state for 10 minutes, and then the copper sintered body-filled silicon substrate was taken out from the container. It was confirmed that the copper sintered body in the through-holes was impregnated with the curable resin composition, and that the curable resin composition reached to the surface of the copper sintered body in the through-holes on the opposite side from the surface coated with the curable resin composition. The curable resin composition remaining on the surface coated with the curable resin composition of the copper sintered body-filled silicon substrate was removed with a rubber spatula. Next, the curable resin composition was applied, using a roll coater, on the surface opposite to the surface coated with the curable resin composition, and the curable resin composition remaining on the surface of the copper sintered body-filled silicon substrate was removed as much as possible using a rubber spatula.
[Curable Resin Composition]
  YDF-170 (manufactured by Tohto Chemical Industry Co., Ltd., trade name of bisphenol F-type epoxy resin, epoxy equivalent=170): 95 parts by mass
  2PZ-CN (manufactured by Shikoku Chemicals Corporation, trade name of an imidazole compound): 5 parts by mass Comparative Example 1

The resin impregnation step was not carried out.
(Resin Curing Step)

Examples 1 to 73

A silicon substrate having through-silicon vias was obtained by maintaining a silicon substrate having the copper sintered body impregnated with the curable resin composition, in a nitrogen atmosphere at 180° C. for one hour.

Comparative Example 1

The resin curing step was not carried out.
(Electric Conductor Removal Step)

Examples 1 to 73 and Comparative Example 1

Both surfaces of a substrate having through-silicon vias were subjected to a mechanical polishing treatment until the thickness of the copper sintered body on both surfaces of the substrate having through-silicon vias became 20 μm. As a sample base for sticking the substrate having through-silicon vias, a ceramic jig (manufactured by Kemet Japan Co., Ltd.) was used, and as a material for sticking the substrate having through-silicon vias to the sample base, ALCOWAX (manufactured by Nikka Seiko Co., Ltd.) was used. Furthermore, as polishing agents, DP-Suspension P-3 μm·1 μm·¼ μm (manufactured by Struers ApS) were used in order.
[Filling Ratio of Resin Cured Product in Electric Conductor]

Examples 1 to 73 and Comparative Example 1

A substrate having through-silicon vias, which had been subjected to a mechanical polishing treatment, was cut in the thickness direction, a cross-section of the center part of a through-hole of the silicon substrate and a cross-section of the electric conductor provided on the principal surfaces of the silicon substrate were exposed by a focused ion beam, and these cross-sections were observed. When the cross-section of the center part of a through-hole of the silicon substrate was observed, an area measuring ±5 μm in the thickness direction of the silicon substrate and ±5 μm in a direction orthogonally intersecting the thickness direction of the silicon substrate, both from the center part of the through-hole, was observed. When the cross-section of the electric conductor provided on the principal surfaces of the silicon substrate was observed, an area measuring 10 μm in the thickness direction of the silicon substrate and 10 μm in a direction orthogonally intersecting the thickness direction of the silicon substrate, in a region from the surface of the electric conductor provided on a principal surface of the silicon substrate to a depth of 5 μm, was observed. Regarding a focused ion beam processing observation apparatus, (manufactured by Hitachi High-Technologies Corporation, trade name: MI4050) was used. For the observation, a cross-sectional image (about 10 μm on each side) of the electric conductor was captured using a scanning electron microscope (manufactured by Hitachi High-Technologies Corporation, trade name: S-3700N) by setting the magnification ratio to 10000 times. Five sites were used as the observation sites. The obtained cross-sectional image was subjected to a binarization treatment using image analysis software (Adobe Photoshop (registered trademark) Elements), such that a sintered copper portion as well as a resin cured product portion and a space not embedded by the resin cured product in the porous portion were divided. At each of the five observation sites, the ratio of the area of the space not embedded by the resin cured product in the porous portion with respect to the total area of the electric conductor cross-section was determined, and this was defined as porosity. The average value of the porosities in the observation of five sites was defined as the porosity of the electric conductor. The filling ratio of the resin cured product in the electric conductor was calculated by inserting the porosity of the copper sintered body and the porosity of the electric conductor into the following Formula (1).

Filling ratio (%) of resin cured product in electric conductor=$[(B-A)/B] \times 100$   Formula (1)

wherein in Formula (1), A represents the porosity (%) of the electric conductor; and B represents the porosity (%) of the copper sintered body.
(Wiring Formation Step (Resist Formation, Etching, and Resist Removal))

Examples 1 to 73 and Comparative Example 1

Figure 10:
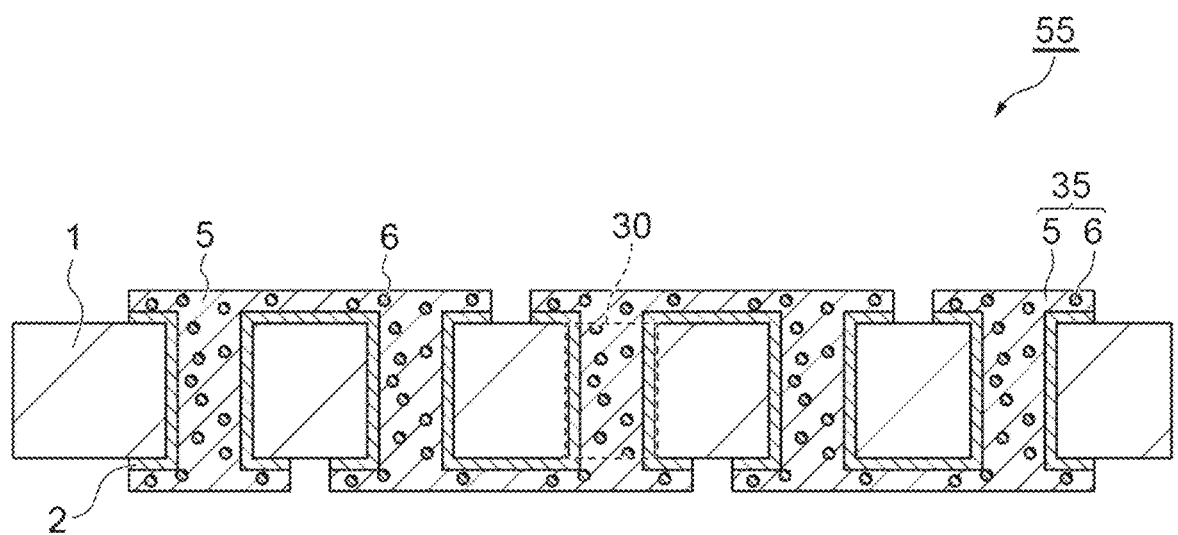
FIG. 10 is a schematic diagram illustrating a test specimen.

A dry film for ultraviolet-curable etching resist H-W425 (manufactured by Hitachi Chemical Industries Co., Ltd., trade name) was pressure-bonded, using a laminator, to the surface of the copper sintered body on both surfaces of a substrate having through-silicon vias, which had been subjected to a mechanical polishing treatment. Subsequently, wiring was formed by joining a photomask, exposing a wiring pattern, and performing resist development, etching of copper sintered body, and resist removal, and a substrate having through-silicon vias (test specimen 55) shown in FIG. 10 was obtained. The obtained substrate having through-silicon vias (test specimen 55) was such that the electric conductor filled in the through-holes was electrically connected to the electric conductor (wiring) provided on the substrate surface.

(Initial Resistance Value)

Examples 1 to 73 and Comparative Example 1

The coupled interconnection resistance value was measured as the initial resistance value of the substrate having through-silicon vias (test specimen 55). When the hole diameter of the through-holes of the silicon substrate was 20 µm, the resistance value of twenty through-holes coupled together was measured; when the hole diameter of the through-holes of the silicon substrate was 30 µm, the resistance value of thirty through-holes coupled together was measured; when the hole diameter of the through-holes of the silicon substrate was 50 µm, the resistance value of thirty through-holes coupled together was measured; when the hole diameter of the through-holes of the silicon substrate was 100 µm, the resistance value of one hundred through-holes coupled together was measured; and when the hole diameter of the through-holes of the silicon substrate was 200 µm, the resistance value of two hundred through-holes coupled together was measured. The coupled interconnection resistance values thus measured were evaluated according to the following criteria. A rating of B or higher was considered satisfactory. The results are shown in Tables 1 to 8.
- A: The resistance value is less than 10 mΩ.
- B: The resistance value is 10 mΩ or more and less than 30 mΩ.
- C: The resistance value is 30 mΩ or more and less than 100 mΩ.
- D: The resistance value is 100 mΩ or more and less than 500 mΩ.
- E: The resistance value is 500 mΩ or more.

(Temperature Cycle Connectivity Test)

Examples 1 to 73 and Comparative Example 1

A substrate having through-silicon vias (test specimen 55) was mounted in a temperature cycle testing machine (TSA-72SE-W, manufactured by Espec Corporation), and a temperature cycle connection reliability test was performed under the conditions of lower temperature side: –40° C., 15 minutes, room temperature: 2 minutes, higher temperature side: 125° C., 15 minutes, defrost cycle: automatic, number of cycles: 50, 100, 300, and 500 cycles. When the hole diameter of the through-holes of the silicon substrate was 20 µm, the resistance value of twenty through-holes coupled together was measured; when the hole diameter of the through-holes of the silicon substrate was 30 µm, the resistance value of thirty through-holes coupled together was measured; when the hole diameter of the through-holes of the silicon substrate was 50 µm, the resistance value of thirty through-holes coupled together was measured; when the hole diameter of the through-holes of the silicon substrate was 100 µm, the resistance value of one hundred through-holes coupled together was measured; and when the hole diameter of the through-holes of the silicon substrate was 200 µm, the resistance value of two hundred through-holes coupled together was measured. The coupled interconnection resistance values thus measured were evaluated according to the following criteria. A rating of B or higher after 500 times of the temperature cycle test was considered satisfactory. The results are shown in Tables 1 to 8.
- A: The resistance change rate is less than 1% with respect to the initial resistance value.
- B: The resistance change rate is 1% or more and less than 3% with respect to the initial resistance value.
- C: The resistance change rate is 3% or more and less than 5% with respect to the initial resistance value.
- D: The resistance change rate is 5% or more and less than 10% with respect to the initial resistance value.
- E: The resistance change rate is 10% or more and less than 20% with respect to the initial resistance value.
- F: The resistance change rate is 20% or more with respect to the initial resistance value.

(Cracking of Substrate)

Examples 1 to 73 and Comparative Example 1

A substrate having through-silicon vias (test specimen 55) was visually inspected, and the presence or absence of cracking in the silicon substrate was checked. A case where there was no cracking was rated as ○, and a case where cracking occurred even partially was rated as x. The results are shown in Tables 1 to 8.

(Airtightness)

Examples 1 to 73 and Comparative Example 1

The airtightness of a substrate having through-silicon vias (test specimen 55) was evaluated. The evaluation was performed using a helium gas leakage detector ("UL200" manufactured by LEYBOLD GmbH). Specifically, the substrate having through-silicon vias was mounted on a jig, vacuum drawing was performed until the inlet pressure of the measuring machine reached 5 Pa, He pressurization (0.1 MPa) was performed for 30 seconds at the time point where the inlet pressure reached 5 Pa, and the leak amount was measured and evaluated according to the following criteria. The results are shown in Tables 1 to 8.
- A: The leak amount is less than $1\times10^{-11}$ Pa·m$^3$/sec.
- B: The leak amount is $1\times10^{-11}$ or more and less than $1\times10^{-10}$ Pa·m$^3$/sec.
- C: The leak amount is $1\times10^{-10}$ or more and less than $1\times10^{-9}$ Pa·m$^3$/sec.
- D: The leak amount is $1\times10^{-9}$ or more and less than $1\times10^{-8}$ Pa·m$^3$/sec.
- E: The leak amount is $1\times10^{-8}$ or more and less than $1\times10^{-6}$ Pa·m$^3$/sec.
- F: The leak amount is $1\times10^{-6}$ Pa·m$^3$/sec or more.

(Close Adhesiveness of Wiring—Pull Strength—)

Examples 1 to 73 and Comparative Example 1

For a substrate having through-silicon vias obtained in the same manner except that a wiring pattern measuring 2 mm×2 mm was formed in the wiring formation step, a stud pin having a tip area of 1 mm$^2$ was vertically joined by soldering, and this was used as a test specimen. The test specimen was fixed, the stud pin was grabbed by chuck parts of a tensile testing machine, the test specimen was pulled vertically upward at an ascending speed of 50 mm/min, and the fracture load at the time when the copper sintered body on a principal surface of the silicon substrate was detached from the silicon substrate was measured. Then, the adhesive strength was calculated from the measured value of the obtained fracture load and the fracture area of the copper sintered layer, using the following formula. Meanwhile, the measured value was an average of ten points and was evaluated according to the following criteria. The results are shown in Tables 1 to 8.

Adhesive strength (MPa)=Fracture load (kgf)/fracture area (mm2)×9.8 (N/kgf).

A: The adhesive strength (MPa) is 50 MPa or more.
B: The adhesive strength (MPa) is 40 MPa or more and less than 50 MPa.
C: The adhesive strength (MPa) is 30 MPa or more and less than 40 MPa.
D: The adhesive strength (MPa) is 20 MPa or more and less than 30 MPa.
E: The adhesive strength (MPa) is 5 MPa or more and less than 20 MPa.
F: The adhesive strength (MPa) is less than 5 MPa.

(Wiring Forming Properties—Presence or Absence of Cracks—)

Examples 1 to 73 and Comparative Example 1

A substrate having through-silicon vias obtained in the same manner except that five wiring patterns each measuring 2 mm×2 mm were formed in the wiring formation step, was inspected using an optical microscope, and the presence or absence of cracks (length 0.5 mm or more) in the wiring pattern was inspected. The magnification ratio was set to 500 times, and the test specimen was evaluated according to the following criteria. The results are shown in Tables 1 to 8.

A: Cracks are not generated.
B: The number of cracks is 1 or more and less than 2.
C: The number of cracks is 2 or more and less than 5.
D: The number of cracks is 5 or more and less than 10.
E: The number of cracks is 10 or more and less than 20.
F: The number of cracks is 20 or more.

(Volume Resistivity)

Examples 1 to 73 and Comparative Example 1

The volume resistivity of the electric conductor formed on the silicon substrate was measured. The volume resistivity was calculated from the surface resistance value measured with a four-end needle surface resistance measuring instrument (manufactured by Mitsubishi Chemical Analytech Co., Ltd., trade name: LORESTA GP) and the film thickness determined by a non-contact surface/layer cross-section shape measurement system (VertScan, Ryoka Systems, Inc.). The results are shown in Tables 1 to 8.

TABLE 1

|  |  |  | Example 1 | Example 2 | Example 3 | Example 4 | Example 5 | Example 6 | Example 7 | Example 8 | Example 9 | Example 10 |
|---|---|---|---|---|---|---|---|---|---|---|---|---|
| Composition (parts by mass) | Second copper particles | Spherical 100 nm | 70 | 70 | 70 | 70 | 70 | 30 | 50 | 80 | 30 | 50 |
|  |  | Spherical 250 nm | — | — | — | — | — | — | — | — | — | — |
|  | First copper particles | Flat 1.4 μm | 30 | 30 | 30 | 30 | 30 | 70 | 50 | 20 | 70 | 50 |
|  |  | Flat 3.1 μm | — | — | — | — | — | — | — | — | — | — |
|  |  | Flat 5.8 μm | — | — | — | — | — | — | — | — | — | — |
|  |  | Flat 7.3 μm | — | — | — | — | — | — | — | — | — | — |
|  | Diethylene glycol |  | 5 | 5 | 5 | 5 | 5 | 5 | 5 | 5 | 5 | 5 |
| Porosity of copper sintered body (%) | Through-holes |  | 7 | 7 | 7 | 7 | 7 | 7 | 7 | 7 | 9 | 9 |
|  | Wiring |  | 6 | 6 | 6 | 6 | 6 | 6 | 6 | 6 | 8 | 8 |
| Filling ratio of resin cured product (%) | Through-holes |  | 100 | 100 | 100 | 100 | 100 | 100 | 100 | 100 | 100 | 100 |
|  | Wiring |  | 100 | 100 | 100 | 100 | 100 | 100 | 100 | 100 | 100 | 100 |
| Calcination temperature (° C.) |  |  | 300 | 300 | 300 | 300 | 300 | 300 | 300 | 300 | 300 | 300 |
| Atmosphere |  |  | 100% $H_2$ | 100% $H_2$ | 100% $H_2$ | 100% $H_2$ | 100% $H_2$ | 100% $H_2$ | 100% $H_2$ | 100% $H_2$ | 100% $H_2$ | 100% $H_2$ |
| Pressurization force (MPa) |  |  | 0.1 | 0.1 | 0.1 | 0.1 | 0.1 | 0.1 | 0.1 | 0.1 | No pressurization | No pressurization |
| Thickness of silicon substrate (μm) |  |  | 500 | 500 | 500 | 500 | 500 | 500 | 500 | 500 | 500 | 500 |
| Hole diameter of through-holes (μm) |  |  | 200 | 100 | 50 | 30 | 20 | 30 | 30 | 30 | 30 | 30 |
| Hole diameter of through-holes/particle size of first copper particles |  |  | 143 | 71 | 36 | 21 | 14 | 21 | 21 | 21 | 21 | 21 |
| Resin impregnation step |  |  | Present | Present | Present | Present | Present | Present | Present | Present | Present | Present |
| Initial resistance value |  |  | B | B | A | A | A | B | A | B | B | A |
| Temperature cycle connection reliability test | 50 times |  | A | A | A | A | A | A | A | A | A | A |
|  | 100 times |  | B | A | A | A | A | B | A | A | B | A |
|  | 300 times |  | B | B | A | A | A | B | A | B | B | A |
|  | 500 times |  | B | B | A | A | A | B | A | B | B | A |
| Cracking of substrate |  |  | ○ | ○ | ○ | ○ | ○ | ○ | ○ | ○ | ○ | ○ |
| Airtightness |  |  | A | A | A | A | A | A | A | A | A | A |
| Close adhesiveness of wiring |  |  | B | B | B | B | B | B | B | B | B | B |
| Wiring forming properties |  |  | B | B | B | B | B | B | B | B | B | B |
| Volume resistivity (μΩ · cm) |  |  | 4.9 | 4.9 | 4.9 | 4.9 | 4.9 | 5.3 | 5.2 | 5.5 | 7.0 | 6.9 |

TABLE 2

| | | | Example 11 | Example 12 | Example 13 | Example 14 | Example 15 | Example 16 | Example 17 | Example 18 | Example 19 | Example 20 |
|---|---|---|---|---|---|---|---|---|---|---|---|---|
| Composition (parts by mass) | Second copper particles | Spherical 100 nm | 80 | 70 | 70 | 70 | 70 | 70 | 70 | 70 | 70 | 70 |
| | | Spherical 250 nm | — | — | — | — | — | — | — | — | — | — |
| | First copper particles | Flat 1.4 μm | 20 | 30 | 30 | 30 | 30 | 30 | 30 | 30 | 30 | 30 |
| | | Flat 3.1 μm | — | — | — | — | — | — | — | — | — | — |
| | | Flat 5.8 μm | — | — | — | — | — | — | — | — | — | — |
| | | Flat 7.3 μm | — | — | — | — | — | — | — | — | — | — |
| | Diethylene glycol | | 5 | 5 | 5 | 5 | 5 | 5 | 5 | 5 | 5 | 5 |
| Porosity of copper sintered body (%) | Through-holes | | 9 | 7 | 7 | 7 | 7 | 7 | 5 | 5 | 5 | 5 |
| | Wiring | | 8 | 5 | 5 | 5 | 5 | 5 | 4 | 4 | 4 | 4 |
| Filling ratio of resin cured product (%) | Through-holes | | 100 | 100 | 100 | 100 | 100 | 100 | 100 | 100 | 100 | 100 |
| | Wiring | | 100 | 100 | 100 | 100 | 100 | 100 | 100 | 100 | 100 | 100 |
| Calcination temperature (° C.) | | | 300 | 300 | 300 | 300 | 300 | 300 | 300 | 300 | 300 | 300 |
| Atmosphere | | | 100% H₂ | 100% H₂ | 100% H₂ | 100% H₂ | 100% H₂ | 100% H₂ | 100% H₂ | 100% H₂ | 100% H₂ | 100% H₂ |
| Pressurization force (MPa) | | | No pressurization | 0.3 | 0.3 | 0.3 | 0.3 | 0.3 | 1 | 1 | 1 | 1 |
| Thickness of silicon substrate (μm) | | | 500 | 500 | 500 | 500 | 500 | 500 | 500 | 500 | 500 | 500 |
| Hole diameter of through-holes (μm) | | | 30 | 200 | 100 | 50 | 30 | 20 | 200 | 100 | 50 | 30 |
| Hole diameter of through-holes/particle size of first copper particles | | | 21 | 143 | 71 | 36 | 21 | 14 | 143 | 71 | 36 | 21 |
| Resin impregnation step | | | Present | Present | Present | Present | Present | Present | Present | Present | Present | Present |
| Initial resistance value | | | B | B | B | A | A | A | B | A | A | A |
| Temperature cycle connection reliability test | 50 times | | A | A | A | A | A | A | A | A | A | A |
| | 100 times | | B | B | A | A | A | A | A | A | A | A |
| | 300 times | | B | B | B | A | A | A | B | A | A | A |
| | 500 times | | B | B | B | A | A | A | B | B | A | A |
| Cracking of substrate | | | ○ | ○ | ○ | ○ | ○ | ○ | ○ | ○ | ○ | ○ |
| Airtightness | | | A | A | A | A | A | A | A | A | A | A |
| Close adhesiveness of wiring | | | B | B | B | B | B | B | A | A | A | A |
| Wiring forming properties | | | B | A | A | A | A | A | A | A | A | A |
| Volume resistivity (μΩ · cm) | | | 7.3 | 4.7 | 4.7 | 4.7 | 4.7 | 4.7 | 4.3 | 4.3 | 4.3 | 4.3 |

TABLE 3

| | | | Example 21 | Example 22 | Example 23 | Example 24 | Example 25 | Example 26 | Example 27 | Example 28 | Example 29 | Example 30 |
|---|---|---|---|---|---|---|---|---|---|---|---|---|
| Composition (parts by mass) | Second copper particles | Spherical 100 nm | 70 | 70 | 70 | 70 | 70 | 70 | 70 | 70 | 70 | 70 |
| | | Spherical 250 nm | — | — | — | — | — | — | — | — | — | — |
| | First copper particles | Flat 1.4 μm | 30 | 30 | 30 | 30 | 30 | 30 | 30 | 30 | 30 | 30 |
| | | Flat 3.1 μm | — | — | — | — | — | — | — | — | — | — |
| | | Flat 5.8 μm | — | — | — | — | — | — | — | — | — | — |
| | | Flat 7.3 μm | — | — | — | — | — | — | — | — | — | — |
| | Diethylene glycol | | 5 | 5 | 5 | 7 | 7 | 7 | 7 | 7 | 7 | 7 |
| Porosity of copper sintered body (%) | Through-holes | | 5 | 8 | 6 | 9 | 9 | 9 | 9 | 9 | 7 | 7 |
| | Wiring | | 4 | 6 | 5 | 7 | 7 | 7 | 7 | 7 | 6 | 6 |
| Filling ratio of resin cured product (%) | Through-holes | | 100 | 100 | 100 | 100 | 100 | 100 | 100 | 100 | 100 | 100 |
| | Wiring | | 100 | 100 | 100 | 100 | 100 | 100 | 100 | 100 | 100 | 100 |
| Calcination temperature (° C.) | | | 300 | 300 | 300 | 300 | 300 | 300 | 300 | 300 | 300 | 300 |
| Atmosphere | | | 100% H₂ | 100% N₂ | 100% N₂ | 100% H₂ | 100% H₂ | 100% H₂ | 100% H₂ | 100% H₂ | 100% H₂ | 100% H₂ |
| Pressurization force (MPa) | | | 1 | 1 | 3 | 0.3 | 0.3 | 0.4 | 0.5 | 0.6 | 1 | 1 |
| Thickness of silicon substrate (μm) | | | 500 | 500 | 500 | 500 | 500 | 500 | 500 | 500 | 500 | 500 |
| Hole diameter of through-holes (μm) | | | 20 | 30 | 30 | 200 | 100 | 50 | 30 | 20 | 200 | 100 |
| Hole diameter of through-holes/particle size of first copper particles | | | 14 | 21 | 21 | 143 | 71 | 36 | 21 | 14 | 143 | 71 |
| Resin impregnation step | | | Present | Present | Present | Present | Present | Present | Present | Present | Present | Present |
| Initial resistance value | | | A | B | B | B | B | A | A | A | B | B |
| Temperature cycle connection reliability test | 50 times | | A | A | A | A | A | A | A | A | A | A |
| | 100 times | | A | B | A | B | A | A | A | A | A | A |
| | 300 times | | A | B | B | B | B | B | A | A | B | B |
| | 500 times | | A | B | B | B | B | B | A | A | B | B |
| Cracking of substrate | | | ○ | ○ | ○ | ○ | ○ | ○ | ○ | ○ | ○ | ○ |
| Airtightness | | | A | A | A | A | A | A | A | A | A | A |
| Close adhesiveness of wiring | | | A | B | B | B | B | B | B | B | B | B |
| Wiring forming properties | | | A | B | B | B | B | B | B | B | A | A |
| Volume resistivity (μΩ · cm) | | | 4.3 | 9.4 | 7.6 | 6.4 | 6.4 | 6.4 | 6.4 | 6.4 | 5.3 | 5.3 |

TABLE 4

|  |  |  | Example 31 | Example 32 | Example 33 | Example 34 | Example 35 | Example 36 | Example 37 | Example 38 | Example 39 | Example 40 |
|---|---|---|---|---|---|---|---|---|---|---|---|---|
| Composition (parts by mass) | Second copper particles | Spherical 100 nm | 70 | 70 | 70 | 70 | 70 | 70 | 70 | 70 | 70 | 70 |
|  |  | Spherical 250 nm | — | — | — | — | — | — | — | — | — | — |
|  | First copper particles | Flat 1.4 μm | 30 | 30 | 30 | 30 | 30 | 30 | 30 | 30 | 30 | 30 |
|  |  | Flat 3.1 μm | — | — | — | — | — | — | — | — | — | — |
|  |  | Flat 5.8 μm | — | — | — | — | — | — | — | — | — | — |
|  |  | Flat 7.3 μm | — | — | — | — | — | — | — | — | — | — |
|  | Diethylene glycol |  | 7 | 7 | 7 | 7 | 7 | 7 | 7 | 7 | 10 | 10 |
| Porosity of copper sintered body (%) | Through-holes |  | 7 | 7 | 7 | 6 | 6 | 6 | 6 | 6 | 7 | 7 |
|  | Wiring |  | 5 | 5 | 5 | 5 | 5 | 5 | 5 | 5 | 5 | 5 |
| Filling ratio of resin cured product (%) | Through-holes |  | 100 | 100 | 100 | 100 | 100 | 100 | 100 | 100 | 100 | 100 |
|  | Wiring |  | 100 | 100 | 100 | 100 | 100 | 100 | 100 | 100 | 100 | 100 |
| Calcination temperature (° C.) |  |  | 300 | 300 | 300 | 300 | 300 | 300 | 300 | 300 | 300 | 300 |
| Atmosphere |  |  | 100% $H_2$ | 100% $H_2$ | 100% $H_2$ | 100% $H_2$ | 100% $H_2$ | 100% $H_2$ | 100% $H_2$ | 100% $H_2$ | 100% $H_2$ | 100% $H_2$ |
| Pressurization force (MPa) |  |  | 1 | 1 | 1 | 3 | 3 | 3 | 3 | 3 | 3 | 3 |
| Thickness of silicon substrate (μm) |  |  | 500 | 500 | 500 | 500 | 500 | 500 | 500 | 500 | 500 | 500 |
| Hole diameter of through-holes (μm) |  |  | 50 | 30 | 20 | 200 | 100 | 50 | 30 | 20 | 200 | 100 |
| Hole diameter of through-holes/particle size of first copper particles |  |  | 36 | 21 | 14 | 143 | 71 | 36 | 21 | 14 | 143 | 71 |
| Resin impregnation step |  |  | Present | Present | Present | Present | Present | Present | Present | Present | Present | Present |
| Initial resistance value |  |  | A | A | A | B | A | A | A | A | B | B |
| Temperature cycle connection reliability test | 50 times |  | A | A | A | A | A | A | A | A | A | A |
|  | 100 times |  | A | A | A | A | A | A | A | A | A | A |
|  | 300 times |  | A | A | A | B | A | A | A | A | B | B |
|  | 500 times |  | B | A | A | B | B | A | A | A | B | B |
| Cracking of substrate |  |  | ○ | ○ | ○ | ○ | ○ | ○ | ○ | ○ | ○ | ○ |
| Airtightness |  |  | A | A | A | A | A | A | A | A | A | A |
| Close adhesiveness of wiring |  |  | B | B | B | A | A | A | A | A | B | B |
| Wiring forming properties |  |  | A | A | A | A | A | A | A | A | A | A |
| Volume resistivity (μΩ · cm) |  |  | 5.3 | 5.3 | 5.3 | 4.8 | 4.8 | 4.8 | 4.8 | 4.8 | 5.5 | 5.5 |

TABLE 5

|  |  |  | Example 41 | Example 42 | Example 43 | Example 44 | Example 45 | Example 46 | Example 47 | Example 48 | Example 49 | Example 50 |
|---|---|---|---|---|---|---|---|---|---|---|---|---|
| Composition (parts by mass) | Second copper particles | Spherical 100 nm | 70 | 70 | 70 | 70 | 70 | — | — | 70 | 70 | 70 |
|  |  | Spherical 250 nm | — | — | — | — | — | 70 | 70 | — | — | — |
|  | First copper particles | Flat 1.4 μm | 30 | 30 | 30 | 30 | 30 | 30 | 30 | — | — | — |
|  |  | Flat 3.1 μm | — | — | — | — | — | — | — | 30 | 30 | 30 |
|  |  | Flat 5.8 μm | — | — | — | — | — | — | — | — | — | — |
|  |  | Flat 7.3 μm | — | — | — | — | — | — | — | — | — | — |
|  | Diethylene glycol |  | 10 | 10 | 10 | 5 | 5 | 5 | 5 | 5 | 5 | 5 |
| Porosity of copper sintered body (%) | Through-holes |  | 7 | 7 | 7 | 9 | 7 | 9 | 5 | 8 | 8 | 8 |
|  | Wiring |  | 5 | 5 | 5 | 7 | 6 | 7 | 7 | 7 | 7 | 7 |
| Filling ratio of resin cured product (%) | Through-holes |  | 100 | 100 | 100 | 100 | 100 | 100 | 100 | 100 | 100 | 100 |
|  | Wiring |  | 100 | 100 | 100 | 100 | 100 | 100 | 100 | 100 | 100 | 100 |
| Calcination temperature (° C.) |  |  | 300 | 300 | 300 | 225 | 250 | 250 | 300 | 300 | 300 | 300 |
| Atmosphere |  |  | 100% $H_2$ | 100% $H_2$ | 100% $H_2$ | 100% $H_2$ | 100% $H_2$ | 100% $H_2$ | 100% $H_2$ | 100% $H_2$ | 100% $H_2$ | 100% $H_2$ |
| Pressurization force (MPa) |  |  | 3 | 3 | 3 | 1 | 1 | 1 | 1 | 0.1 | 0.1 | 0.1 |
| Thickness of silicon substrate (μm) |  |  | 500 | 500 | 500 | 500 | 500 | 500 | 500 | 500 | 500 | 500 |
| Hole diameter of through-holes (μm) |  |  | 50 | 30 | 20 | 30 | 30 | 30 | 30 | 200 | 100 | 50 |
| Hole diameter of through-holes/particle size of first copper particles |  |  | 36 | 21 | 14 | 21 | 21 | 21 | 21 | 64.5 | 32.3 | 16.1 |
| Resin impregnation step |  |  | Present | Present | Present | Present | Present | Present | Present | Present | Present | Present |
| Initial resistance value |  |  | A | A | A | A | A | A | A | B | A | A |
| Temperature cycle connection reliability test | 50 times |  | A | A | A | A | A | A | A | A | A | A |
|  | 100 times |  | A | A | A | A | A | A | A | A | A | A |
|  | 300 times |  | B | B | A | A | A | A | A | B | A | A |
|  | 500 times |  | B | B | B | A | A | A | A | B | A | A |
| Cracking of substrate |  |  | ○ | ○ | ○ | ○ | ○ | ○ | ○ | ○ | ○ | ○ |
| Airtightness |  |  | A | A | A | A | A | A | A | A | A | A |
| Close adhesiveness of wiring |  |  | B | B | B | B | B | A | B | B | B | B |
| Wiring forming properties |  |  | A | A | A | B | A | A | B | A | B | B |
| Volume resistivity (μΩ · cm) |  |  | 5.5 | 5.5 | 5.5 | 6.9 | 5.3 | 6.2 | 4.3 | 4.9 | 4.9 | 4.9 |

TABLE 6

|  |  |  | Example 51 | Example 52 | Example 53 | Example 54 | Example 55 | Example 56 | Example 57 | Example 58 | Example 59 | Example 60 |
|---|---|---|---|---|---|---|---|---|---|---|---|---|
| Composition (parts by mass) | Second copper particles | Spherical 100 nm | 70 | 70 | 70 | 70 | 70 | 70 | 70 | 70 | 70 | 70 |
|  |  | Spherical 250 nm | — | — | — | — | — | — | — | — | — | — |
|  | First copper particles | Flat 1.4 μm | — | — | — | — | — | — | — | — | — | — |
|  |  | Flat 3.1 μm | 30 | 30 | 30 | 30 | 30 | 30 | 30 | — | — | — |
|  |  | Flat 5.8 μm | — | — | — | — | — | — | — | 30 | 30 | 30 |
|  |  | Flat 7.3 μm | — | — | — | — | — | — | — | — | — | — |
|  | Diethylene glycol |  | 5 | 5 | 5 | 5 | 5 | 5 | 5 | 5 | 5 | 5 |
| Porosity of copper sintered body (%) | Through-holes |  | 8 | 8 | 5 | 5 | 5 | 5 | 5 | 8 | 8 | 8 |
|  | Wiring |  | 7 | 7 | 4 | 4 | 4 | 4 | 4 | 6 | 6 | 6 |
| Filling ratio of resin cured product (%) | Through-holes |  | 100 | 100 | 100 | 100 | 100 | 100 | 100 | 100 | 100 | 100 |
|  | Wiring |  | 100 | 100 | 100 | 100 | 100 | 100 | 100 | 100 | 100 | 100 |
| Calcination temperature (° C.) |  |  | 300 | 300 | 300 | 300 | 300 | 300 | 300 | 300 | 300 | 300 |
| Atmosphere |  |  | 100% $H_2$ | 100% $H_2$ | 100% $H_2$ | 100% $H_2$ | 100% $H_2$ | 100% $H_2$ | 100% $H_2$ | 100% $H_2$ | 100% $H_2$ | 100% $H_2$ |
| Pressurization force (MPa) |  |  | 0.1 | 0.1 | 1 | 1 | 1 | 1 | 1 | 0.1 | 0.1 | 0.1 |
| Thickness of silicon substrate (μm) |  |  | 500 | 500 | 500 | 500 | 500 | 500 | 500 | 500 | 500 | 500 |
| Hole diameter of through-holes (μm) |  |  | 30 | 20 | 200 | 100 | 50 | 30 | 20 | 200 | 100 | 50 |
| Hole diameter of through-holes/particle size of first copper particles |  |  | 9.7 | 6.5 | 64.5 | 32.3 | 16.1 | 9.7 | 6.5 | 34.5 | 17.2 | 8.6 |
| Resin impregnation step |  |  | Present | Present | Present | Present | Present | Present | Present | Present | Present | Present |
| Initial resistance value |  |  | A | B | A | A | A | A | B | A | A | B |
| Temperature cycle connection reliability test | 50 times |  | A | A | A | A | A | A | A | A | A | A |
|  | 100 times |  | A | B | A | A | A | A | A | A | A | A |
|  | 300 times |  | A | B | A | A | A | A | B | A | A | B |
|  | 500 times |  | A | B | B | A | A | A | B | A | A | B |
| Cracking of substrate |  |  | ○ | ○ | ○ | ○ | ○ | ○ | ○ | ○ | ○ | ○ |
| Airtightness |  |  | A | A | A | A | A | A | A | A | A | A |
| Close adhesiveness of wiring |  |  | B | B | A | A | A | A | A | B | B | B |
| Wiring forming properties |  |  | B | B | A | A | A | A | A | B | B | B |
| Volume resistivity (μΩ·cm) |  |  | 4.9 | 4.9 | 4.3 | 4.3 | 4.3 | 4.3 | 4.3 | 4.9 | 4.9 | 4.9 |

TABLE 7

|  |  |  | Example 61 | Example 62 | Example 63 | Example 64 | Example 65 | Example 66 | Example 67 | Example 68 | Example 69 | Example 70 |
|---|---|---|---|---|---|---|---|---|---|---|---|---|
| Composition (parts by mass) | Second copper particles | Spherical 100 nm | 70 | 70 | 70 | 70 | 70 | 70 | 70 | 70 | 70 | 70 |
|  |  | Spherical 250 nm | — | — | — | — | — | — | — | — | — | — |
|  | First copper particles | Flat 1.4 μm | — | — | — | — | — | — | — | — | — | — |
|  |  | Flat 3.1 μm | — | — | — | — | — | — | — | — | — | — |
|  |  | Flat 5.8 μm | 30 | 30 | 30 | 30 | 30 | — | — | — | — | — |
|  |  | Flat 7.3 μm | — | — | — | — | — | 30 | 30 | 30 | 30 | 30 |
|  | Diethylene glycol |  | 5 | 5 | 5 | 5 | 5 | 5 | 5 | 5 | 5 | 5 |
| Porosity of copper sintered body (%) | Through-holes |  | 8 | 5 | 5 | 5 | 5 | 8 | 8 | 8 | 8 | 5 |
|  | Wiring |  | 6 | 4 | 4 | 4 | 4 | 6 | 6 | 6 | 6 | 4 |
| Filling ratio of resin cured product (%) | Through-holes |  | 100 | 100 | 100 | 100 | 100 | 100 | 100 | 100 | 100 | 100 |
|  | Wiring |  | 100 | 100 | 100 | 100 | 100 | 100 | 100 | 100 | 100 | 100 |
| Calcination temperature (° C.) |  |  | 300 | 300 | 300 | 300 | 300 | 300 | 300 | 300 | 300 | 300 |
| Atmosphere |  |  | 100% $H_2$ | 100% $H_2$ | 100% $H_2$ | 100% $H_2$ | 100% $H_2$ | 100% $H_2$ | 100% $H_2$ | 100% $H_2$ | 100% $H_2$ | 100% $H_2$ |
| Pressurization force (MPa) |  |  | 0.1 | 1 | 1 | 1 | 1 | 0.1 | 0.1 | 0.1 | 0.1 | 1 |
| Thickness of silicon substrate (μm) |  |  | 500 | 500 | 500 | 500 | 500 | 500 | 500 | 500 | 500 | 500 |
| Hole diameter of through-holes (μm) |  |  | 30 | 200 | 100 | 50 | 30 | 200 | 100 | 50 | 30 | 200 |
| Hole diameter of through-holes/particle size of first copper particles |  |  | 5.2 | 34.5 | 17.2 | 8.6 | 5.2 | 27.4 | 13.7 | 6.8 | 4.1 | 27.4 |
| Resin impregnation step |  |  | Present | Present | Present | Present | Present | Present | Present | Present | Present | Present |
| Initial resistance value |  |  | B | A | A | A | B | A | A | B | B | A |
| Temperature cycle connection reliability test | 50 times |  | A | A | A | A | A | A | A | A | A | A |
|  | 100 times |  | B | A | A | A | A | A | A | A | B | A |
|  | 300 times |  | B | A | A | A | B | A | A | B | B | A |
|  | 500 times |  | B | A | A | B | B | A | A | B | B | A |
| Cracking of substrate |  |  | ○ | ○ | ○ | ○ | ○ | ○ | ○ | ○ | ○ | ○ |
| Airtightness |  |  | A | A | A | A | A | A | A | A | A | A |
| Close adhesiveness of wiring |  |  | B | A | A | A | B | B | B | B | B | A |
| Wiring forming properties |  |  | B | A | A | A | B | B | B | B | B | A |
| Volume resistivity (μΩ·cm) |  |  | 4.9 | 4.3 | 4.3 | 4.3 | 4.3 | 4.9 | 4.9 | 4.9 | 4.9 | 4.3 |

TABLE 8

|  |  |  | Example 71 | Example 72 | Example 73 | Comparative Example 1 |
|---|---|---|---|---|---|---|
| Composition (parts by mass) | Second copper particles | Spherical 100 nm | 70 | 70 | 70 | 70 |
|  |  | Spherical 250 nm | — | — | — | — |
|  | First copper particles | Flat 1.4 μm | — | — | — | 30 |
|  |  | Flat 3.1 μm | — | — | — | — |
|  |  | Flat 5.8 μm | — | — | — | — |
|  |  | Flat 7.3 μm | 30 | 30 | 30 | — |
|  | Diethylene glycol | | 5 | 5 | 5 | 5 |
| Porosity of copper sintered body (%) | Through-holes | | 5 | 5 | 5 | 13 |
|  | Wiring | | 4 | 4 | 4 | 4 |
| Filling ratio of resin cured product (%) | Through-holes | | 100 | 100 | 100 | 100 |
|  | Wiring | | 100 | 100 | 100 | 100 |
| Calcination temperature (° C.) | | | 300 | 300 | 300 | 300 |
| Atmosphere | | | 100% $H_2$ | 100% $H_2$ | 100% $H_2$ | 100% $H_2$ |
| Pressurization force (MPa) | | | 1 | 1 | 1 | 1 |
| Thickness of silicon substrate (μm) | | | 500 | 500 | 500 | 500 |
| Hole diameter of through-holes (μm) | | | 100 | 50 | 30 | 30 |
| Hole diameter of through-holes/particle size of first copper particles | | | 13.7 | 6.8 | 4.1 | 21 |
| Resin impregnation step | | | Present | Present | Present | Absent |
| Initial resistance value | | | A | A | B | C |
| Temperature cycle connection reliability test | 50 times | | A | A | A | C |
|  | 100 times | | A | A | B | D |
|  | 300 times | | A | B | B | E |
|  | 500 times | | A | B | B | E |
| Cracking of substrate | | | ○ | ○ | ○ | ○ |
| Airtightness | | | A | A | A | A |
| Close adhesiveness of wiring | | | A | A | A | B |
| Wiring forming properties | | | A | A | A | D |
| Volume resistivity (μΩ · cm) | | | 4.3 | 4.3 | 4.3 | 14.3 |

REFERENCE SIGNS LIST

1: silicon wafer, 2: metal coating film, 3: copper paste, 4: pores, 5: copper sintered body, 6: resin cured product, 8: etching resist, 9: wiring, 15: fine bump, 20: cured product of adhesive, 25: interposer substrate, 27: wiring, 30: through-hole, 31: non-through-hole, 35: electric conductor, 40, 41: silicon substrate, 50, 60: copper sintered body-filled silicon substrate, 51, 52, 61: substrate having through-silicon vias, 55: test specimen, 100, 200, 300: semiconductor device, A: pressurizing jig.

The invention claimed is:

1. A method for producing a substrate having through-silicon vias, the method comprising:
   a preparation step of preparing a silicon substrate including a silicon wafer provided with through-holes, the silicon substrate having the through-holes communicating with both principal surfaces;
   a copper sintered body formation step of forming a copper sintered body having a porous structure such that the copper sintered body fills at least the through-holes; and then
   a resin impregnation step of impregnating the copper sintered body with a curable resin composition; and then
   a resin curing step of curing the curable resin composition impregnated into the copper sintered body to form an electric conductor including the copper sintered body, the copper sintered body having pores filled with a resin cured product, and providing through-silicon vias in the through-holes.

2. The method according to claim 1, wherein the filling ratio of the resin cured product in the electric conductor is 80% by volume or more based on the volume of the internal space of the pores.

3. The method according to claim 1, wherein the porosity of the copper sintered body is 1% to 15% by volume based on the volume of the copper sintered body.

4. The method according to claim 1, wherein in the copper sintered body formation step, the copper sintered body is formed so as to cover at least a portion of the principal surfaces of the silicon substrate.

5. The method according to claim 4, further comprising an electric conductor removal step of removing at least a portion of the electric conductor formed on the principal surfaces of the silicon substrate.

6. The method according to claim 5, wherein the removing means for the electric conductor removal step is one or more selected from the group consisting of etching, mechanical polishing, and chemical mechanical polishing.

7. The method according to claim 1, wherein the silicon substrate includes a metal coating film provided at least on the wall surfaces of the through-holes.

8. The method according to claim 1, wherein the ratio L/D of the length L to the hole diameter D of the through-silicon vias is 10 or more.

9. The method according to claim 1, wherein the copper sintered body formation step includes:
   a copper paste filling step of filling the through-holes of the silicon substrate with a copper paste including copper particles; and
   a copper paste calcining step of calcining the copper paste to form the copper sintered body.

10. The method according to claim 9, wherein the copper paste includes, as the copper particles, first copper particles having a particle size of 0.8 μm or more and second copper particles having a particle size of 0.5 μm or less.

11. The method according to claim 10, wherein the first copper particles have a flat shape.

12. The method according to claim 9, wherein the copper paste is calcined at an added pressure of 0.1 MPa or higher.

13. The method according to claim 9, wherein the copper paste is calcined in an atmosphere including nitrogen or hydrogen.

* * * * *